United States Patent
Liang et al.

(10) Patent No.: US 10,692,769 B2
(45) Date of Patent: Jun. 23, 2020

(54) FIN CRITICAL DIMENSION LOADING OPTIMIZATION

(71) Applicant: Taiwan Semiconductor Manufacturing Co., Ltd., Hsinchu (TW)

(72) Inventors: Chia Ming Liang, Taipei (TW); Yi-Shien Mor, Hsinchu (TW); Huai-Hsien Chiu, Taipei (TW); Chi-Hsin Chang, Taipei (TW); Jin-Aun Ng, Hsinchu (TW); Yi-Juei Lee, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 15/799,611

(22) Filed: Oct. 31, 2017

(65) Prior Publication Data
US 2019/0067112 A1 Feb. 28, 2019

Related U.S. Application Data

(60) Provisional application No. 62/551,624, filed on Aug. 29, 2017.

(51) Int. Cl.
*H01L 21/8234* (2006.01)
*H01L 27/088* (2006.01)
(Continued)

(52) U.S. Cl.
CPC .... *H01L 21/823431* (2013.01); *H01L 21/308* (2013.01); *H01L 21/823412* (2013.01);
(Continued)

(58) Field of Classification Search
CPC ..... H01L 21/823431; H01L 21/823437; H01L 21/308; H01L 21/823412; H01L 27/0886; H01L 29/66545; H01L 29/7853
See application file for complete search history.

(56) References Cited

U.S. PATENT DOCUMENTS 8,026,138 B2 * 9/2011 Lee ............... H01L 27/10876
257/E27.095
8,813,014 B2  8/2014 Yu et al.
(Continued)

FOREIGN PATENT DOCUMENTS

CN      101562194       10/2009
JP    2006293081 A      10/2006
(Continued)

*Primary Examiner* — Christine A Enad
(74) *Attorney, Agent, or Firm* — Haynes and Boone, LLP

(57) ABSTRACT

Integrated circuit devices having optimized fin critical dimension loading are disclosed herein. An exemplary integrated circuit device includes a core region that includes a first multi-fin structure and an input/output region that includes a second multi-fin structure. The first multi-fin structure has a first width and the second multi-fin structure has a second width. The first width is greater than the second width. In some implementations, the first multi-fin structure has a first fin spacing and the second multi-fin structure has a second fin spacing. The first fin spacing is less than the second fin spacing. In some implementations, a first adjacent fin pitch of the first multi-fin structure is greater than or equal to three times a minimum fin pitch and a second adjacent fin pitch of the second multi-fin structure is less than or equal to two times the minimum fin pitch.

20 Claims, 11 Drawing Sheets

(51) Int. Cl.
  *H01L 29/10*    (2006.01)
  *H01L 29/66*    (2006.01)
  *H01L 21/308*   (2006.01)
  *H01L 29/78*    (2006.01)

(52) U.S. Cl.
  CPC ........... *H01L 21/823437* (2013.01); *H01L 21/823456* (2013.01); *H01L 27/0886* (2013.01); *H01L 29/1037* (2013.01); *H01L 29/66545* (2013.01); *H01L 29/7853* (2013.01)

(56) References Cited

U.S. PATENT DOCUMENTS

| | | | |
|---|---|---|---|
| 8,878,308 B2 | 11/2014 | Chen et al. | |
| 9,418,994 B1* | 8/2016 | Chao | H01L 27/0886 |
| 9,449,975 B1 | 9/2016 | Ching et al. | |
| 9,460,259 B2* | 10/2016 | Baek | G06F 17/5072 |
| 9,691,664 B1 | 6/2017 | Sung et al. | |
| 9,818,648 B2* | 11/2017 | Chao | H01L 21/82343 |
| 2005/0153490 A1* | 7/2005 | Yoon | H01L 21/84 |
| | | | 438/164 |
| 2006/0228636 A1 | 10/2006 | Mashita | |
| 2009/0294857 A1* | 12/2009 | Lee | H01L 27/10876 |
| | | | 257/365 |
| 2011/0121406 A1 | 5/2011 | Lee et al. | |
| 2013/0037871 A1 | 2/2013 | Sudo | |
| 2013/0221443 A1* | 8/2013 | Lin | H01L 27/0924 |
| | | | 257/368 |
| 2013/0334602 A1 | 12/2013 | Guo et al. | |
| 2014/0077303 A1 | 3/2014 | Baek | |
| 2016/0055285 A1* | 2/2016 | Baek | G06F 17/5072 |
| | | | 716/122 |
| 2016/0111420 A1* | 4/2016 | Zhang | H01L 29/7851 |
| | | | 257/392 |
| 2016/0218010 A1 | 7/2016 | Lee et al. | |
| 2017/0077094 A1* | 3/2017 | Tsao | H01L 27/0886 |
| 2017/0148681 A1 | 5/2017 | Basker et al. | |

FOREIGN PATENT DOCUMENTS

| | | |
|---|---|---|
| KR | 20160091164 A | 8/2016 |
| TW | 201419451 A1 | 5/2014 |
| TW | 201428970 A | 7/2014 |
| WO | WO 2016/209253 A1 | 12/2016 |

\* cited by examiner

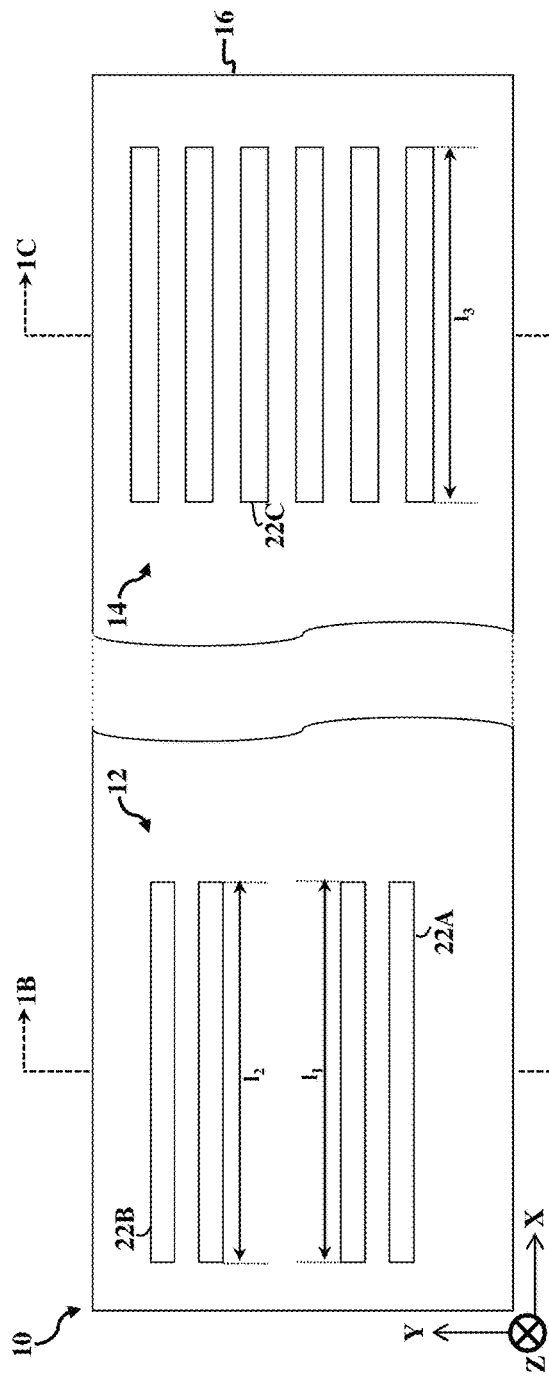
FIG. 1A
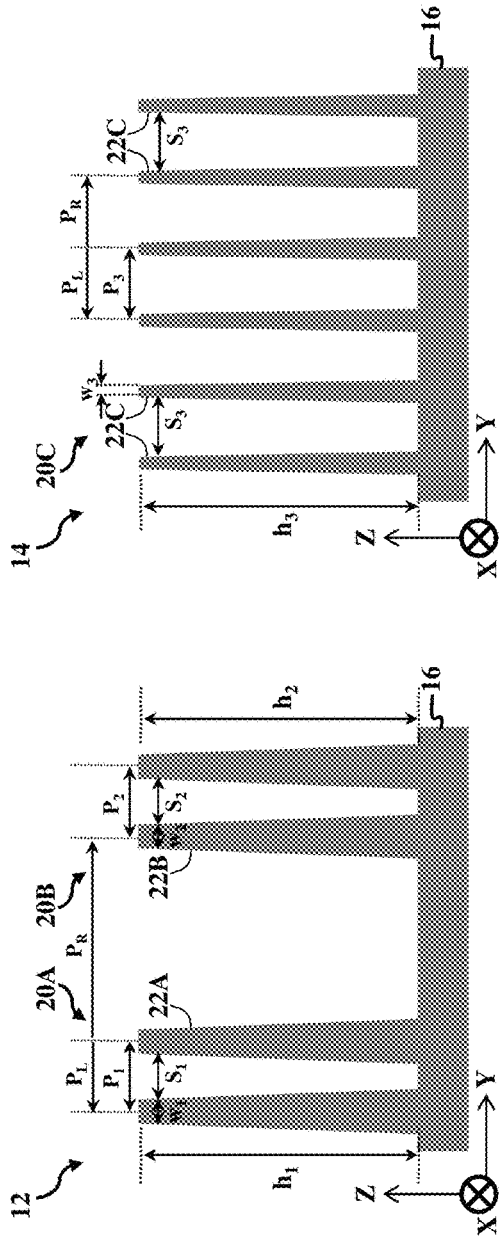
FIG. 1B
FIG. 1C

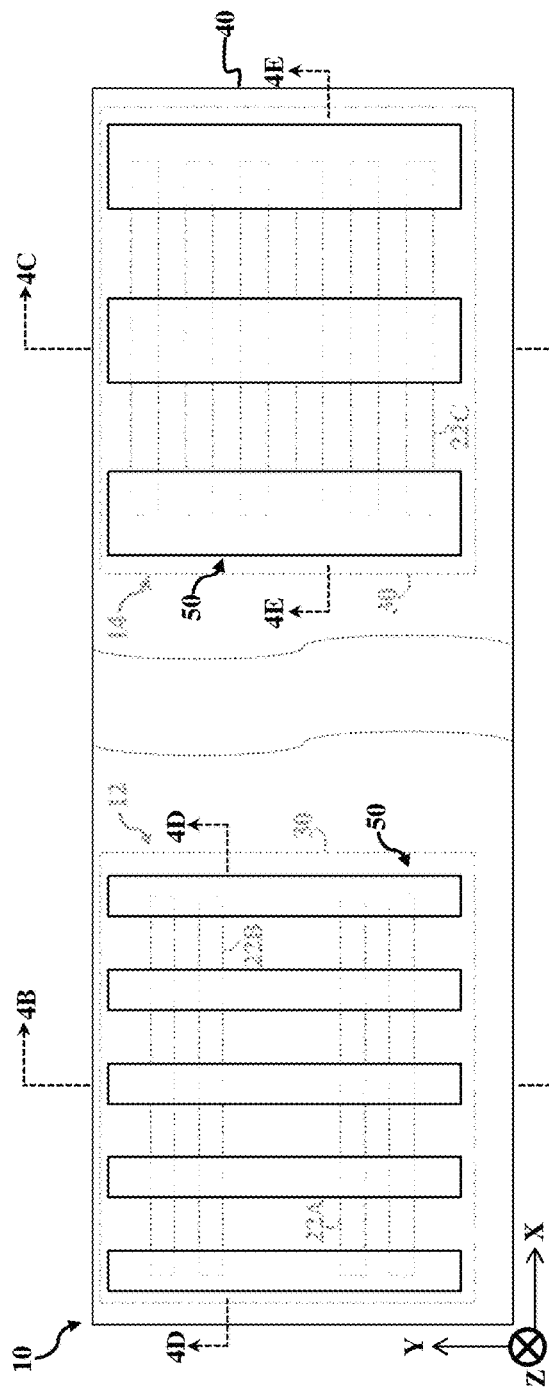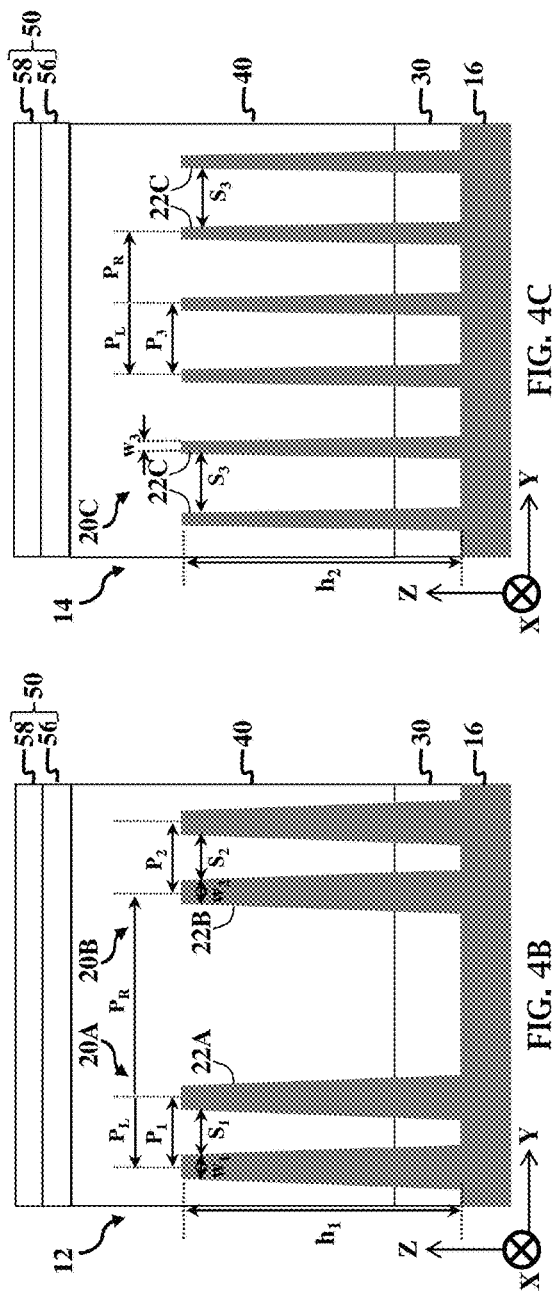

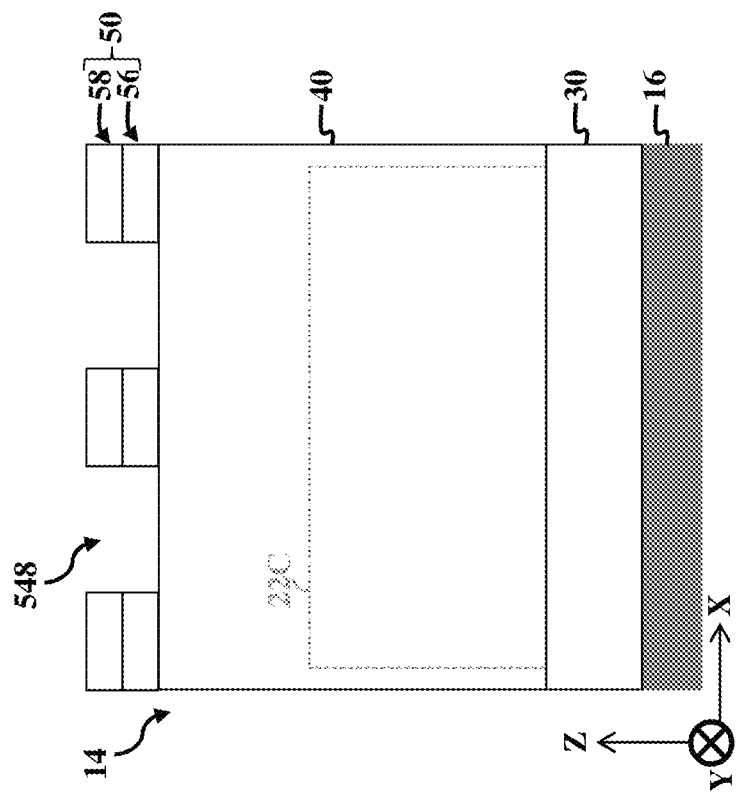
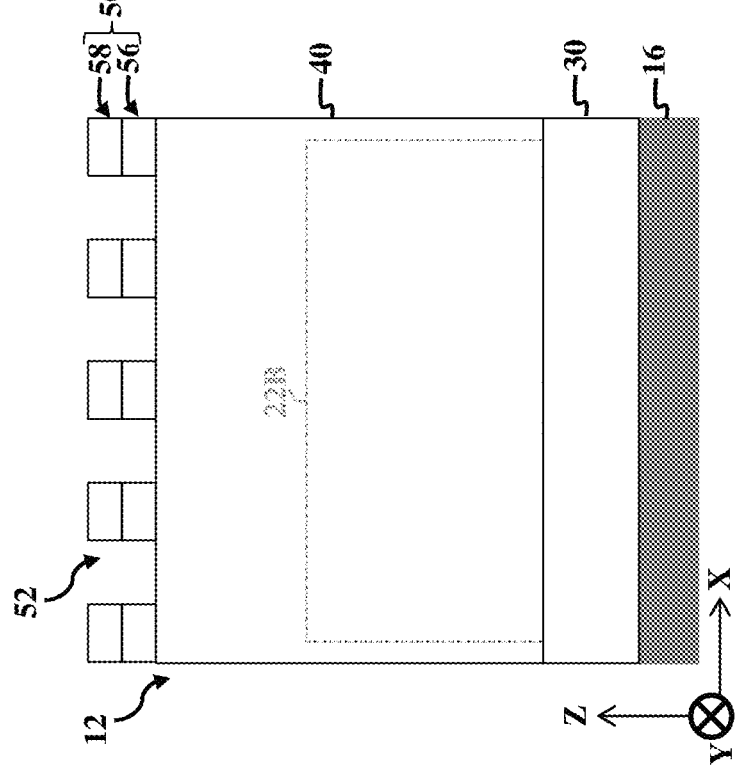
FIG. 4D
FIG. 4E

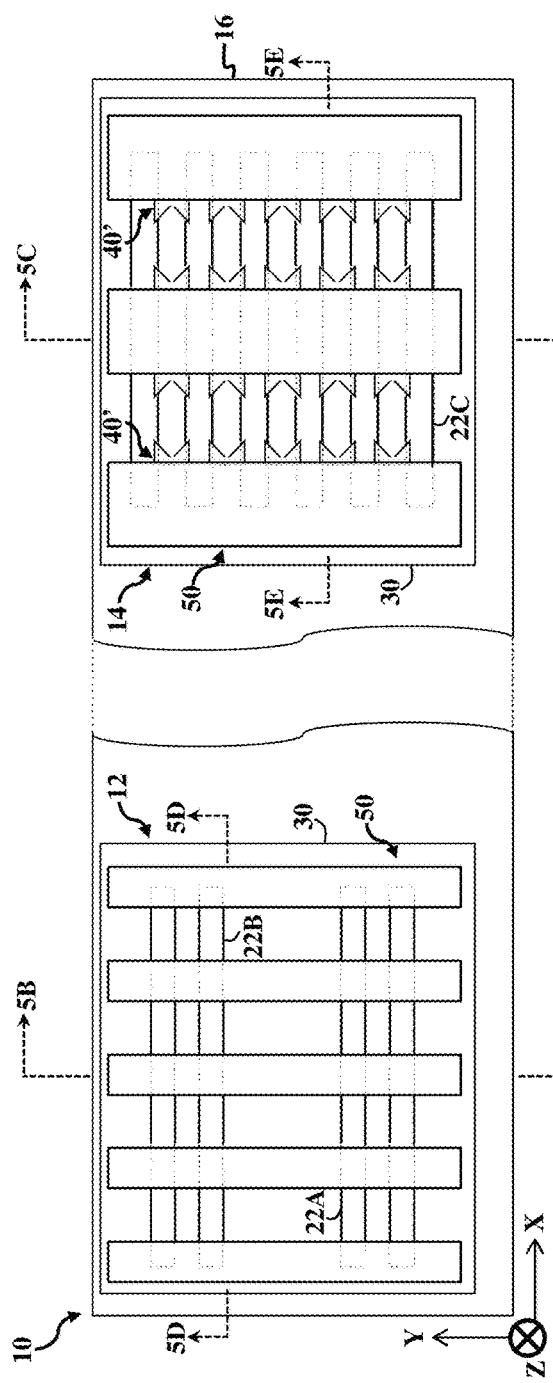
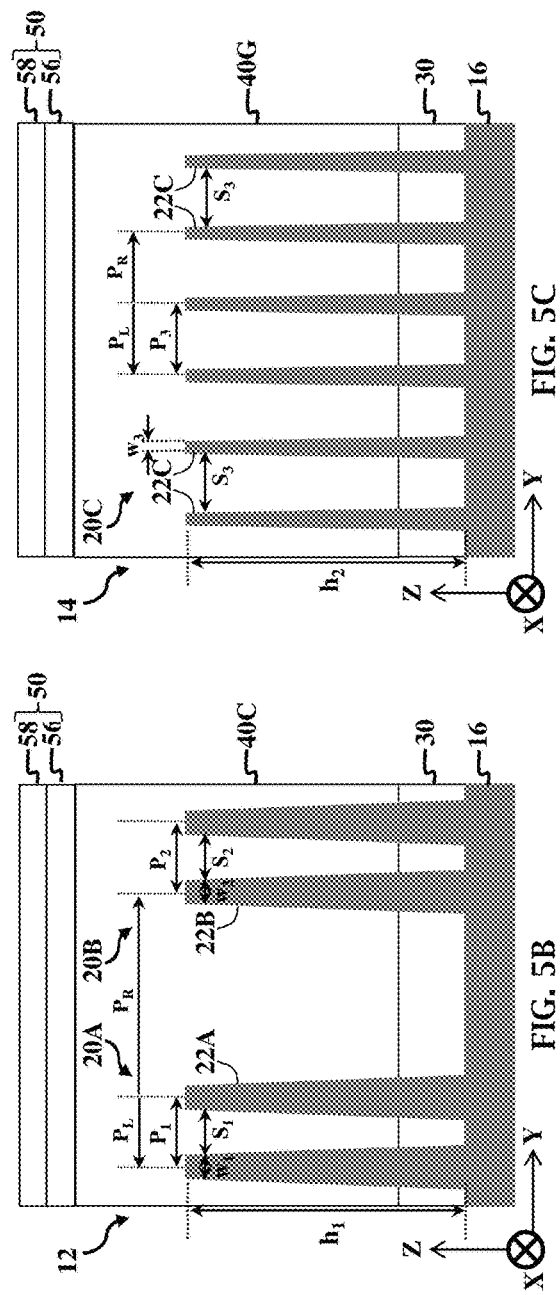
FIG. 5A
FIG. 5B
FIG. 5C

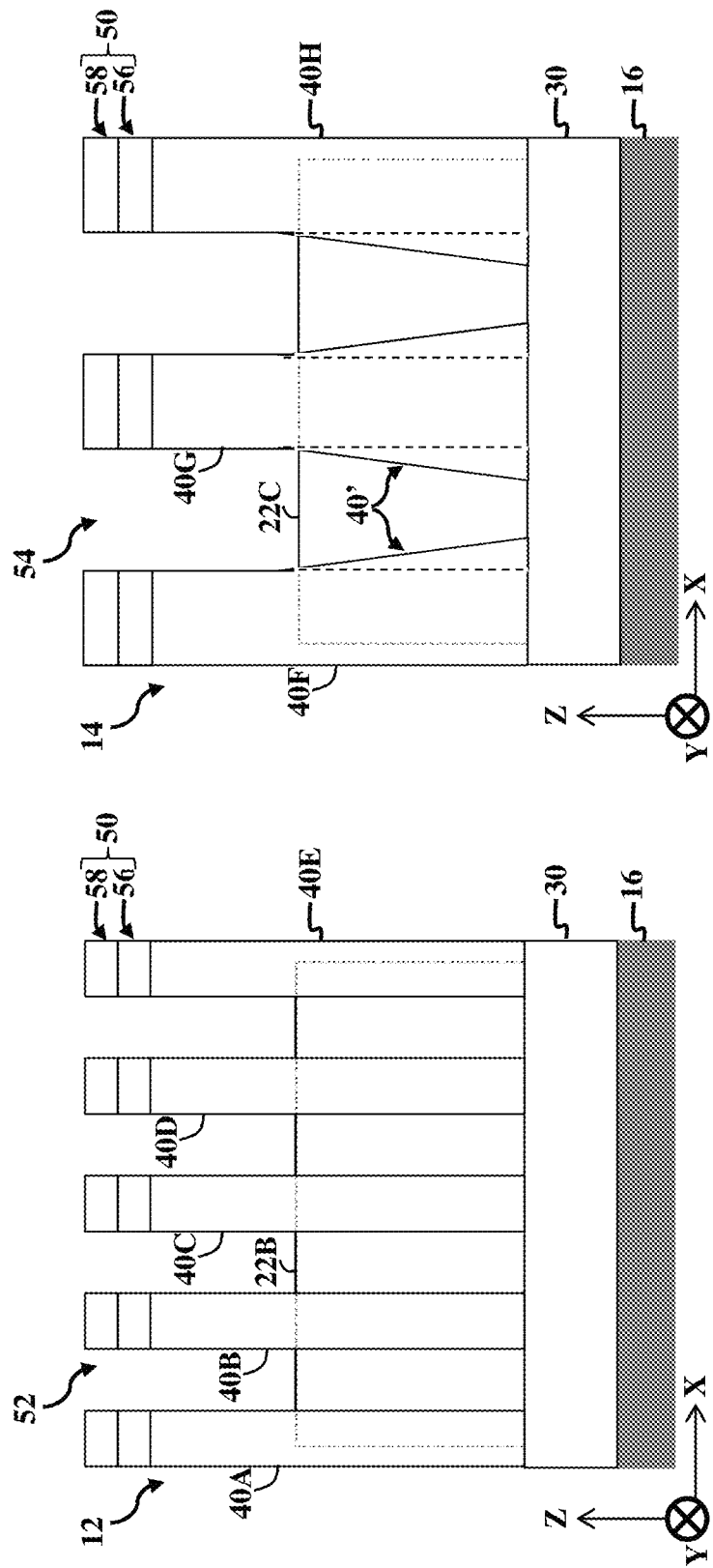

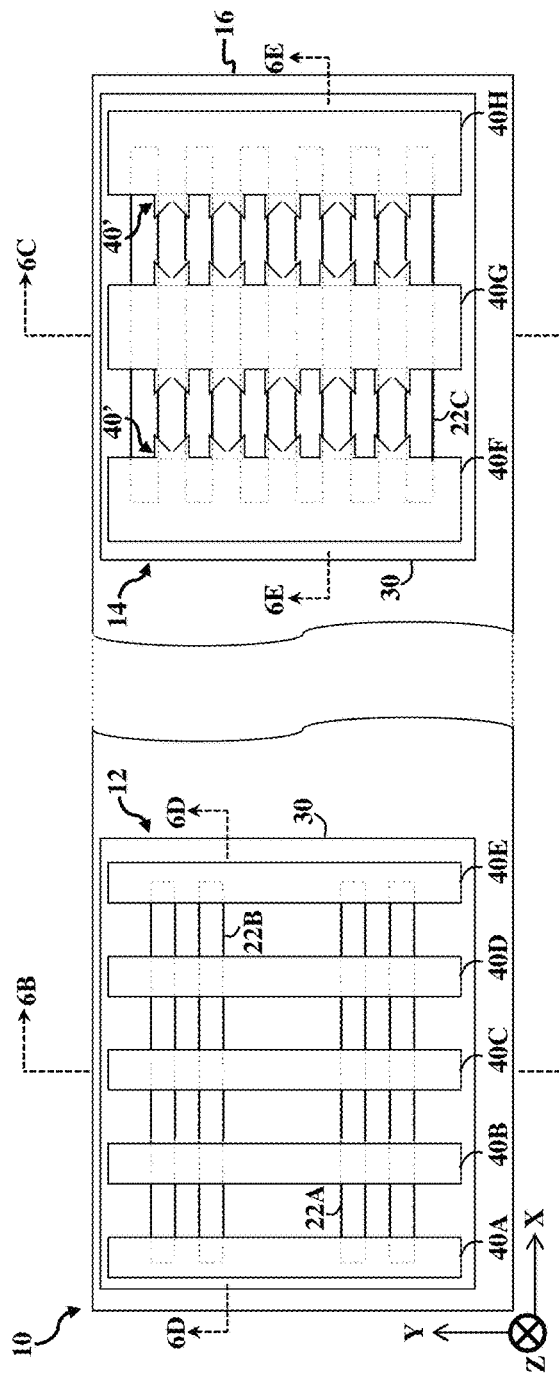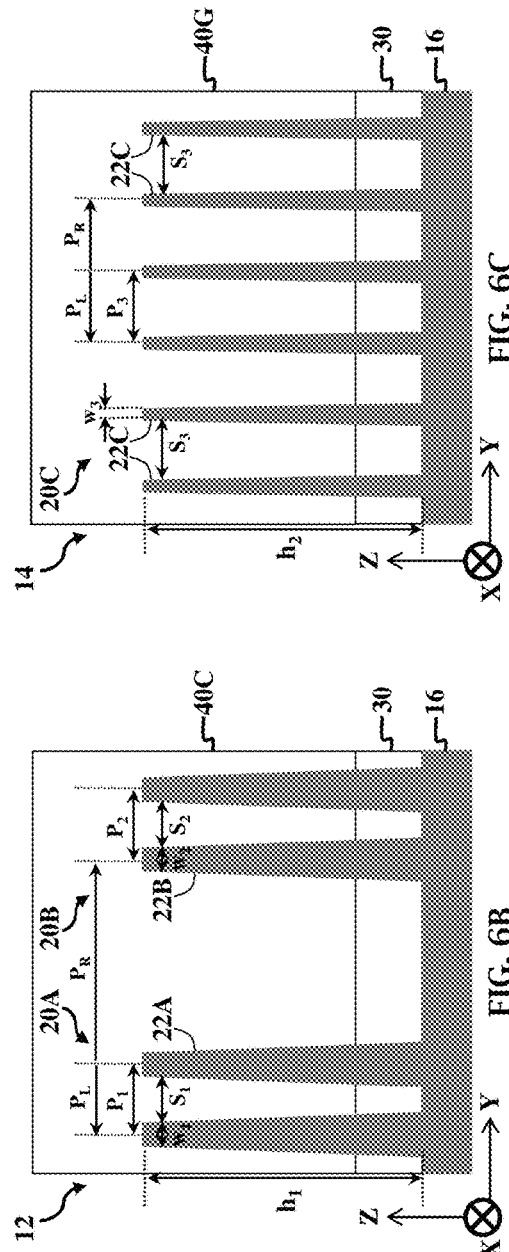

FIN CRITICAL DIMENSION LOADING OPTIMIZATION

This application claims priority to U.S. Provisional Patent Application Ser. No. 62/551,624 Entitled "Fin Critical Dimension Loading Optimization" and filed Aug. 29, 2017, the entire disclosure of which is hereby incorporated by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes, FinFET fabrication processes are significantly constrained by decreasing process margins. In particular, where multiple fin densities are present, decreasing fin pitches and increasing fin heights prevent conventional etching processes from completely or sufficiently removing material between fins. Consequently, not all advantages of FinFET devices can be realized.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1C, FIGS. 2A-2C, FIGS. 3A-3C, FIGS. 4A-4E, FIGS. 5A-5E, and FIGS. 6A-6E are fragmentary diagrammatic views of an integrated circuit device, in portion or entirety, at various fabrication stages according to various aspects of the present disclosure.

DETAILED DESCRIPTION

Figure 2A:
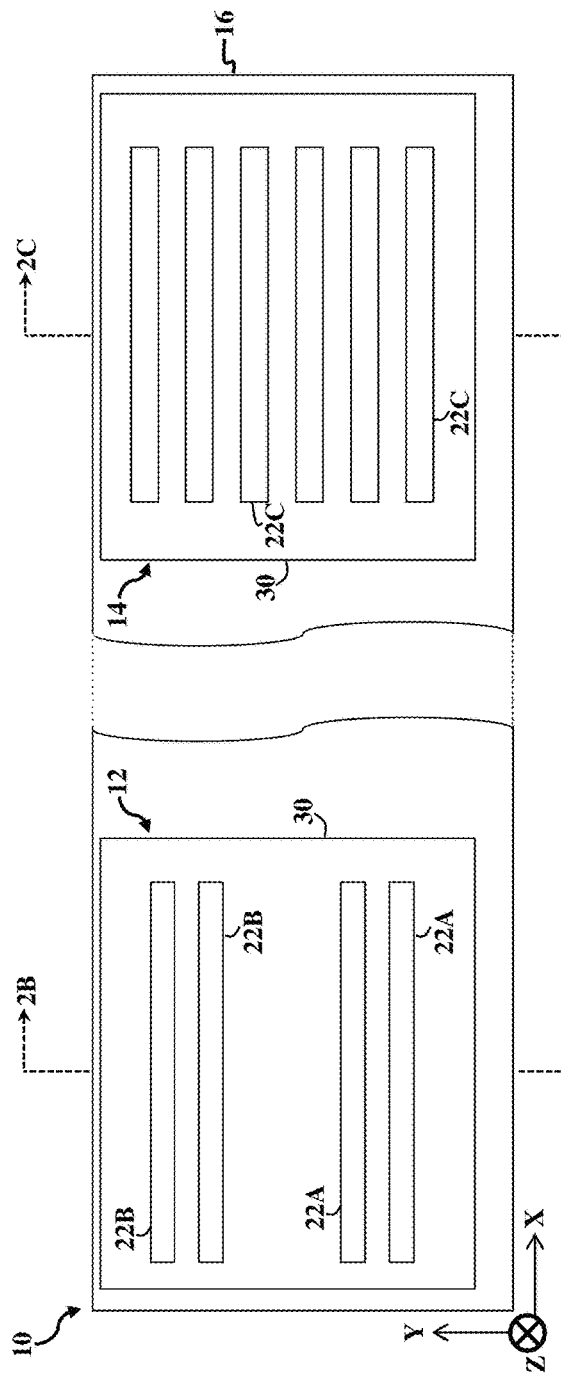

The present disclosure relates generally to integrated circuit devices, and more particularly, to fin-like field effect transistor (FinFET) devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1C, FIGS. 2A-2C, FIGS. 3A-3C, FIGS. 4A-4E, FIGS. 5A-5E, and FIGS. 6A-6E are fragmentary diagrammatic views of an integrated circuit device 10, in portion or entirety, at various fabrication stages according to various aspects of the present disclosure. Integrated circuit device 10 includes various device regions, such as a core region (often referred to as a logic region), a memory region (such as a static random access memory (SRAM) region), an analog region, a peripheral region (often referred to as an input/output (I/O) region), a dummy region, other suitable region, or combinations thereof. In the depicted embodiment, integrated circuit device 10 includes a core region 12 and an I/O region 14, each of which can include various passive and active microelectronic devices, such as resistors, capacitors, inductors, diodes, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. As described herein, core region 12 and I/O region 14 each include one or more fin-like field effect transistors (FinFETs). Integrated circuit device 10 may be included in a microprocessor, a memory, and/or other integrated circuit device. In some implementations, integrated circuit device 10 may be a portion of an IC chip, a system on chip (SoC), or portion thereof. FIGS. 1A-1C, FIGS. 2A-2C, FIGS. 3A-3C, FIGS. 4A-4E, FIGS. 5A-5E, and FIGS. 6A-6E have been simplified for the sake of clarity to better understand the inventive concepts of the present disclosure. Additional features can be added in integrated circuit device 10, and some of the features described below can be replaced, modified, or eliminated in other embodiments of integrated circuit device 10.

Turning to FIGS. 1A-1C, FIG. 1A is a top view of integrated circuit device 10, FIG. 1B is a fragmentary cross-sectional view of integrated circuit device 10 along line 1B-1B of FIG. 1A, and FIG. 1C is a fragmentary cross-sectional view of integrated circuit device 10 along line 1C-1C of FIG. 1A. Core region 12 and I/O region 14 each include at least one fin structure disposed over a substrate (wafer) 16. In the depicted embodiment, substrate 16 includes silicon. Alternatively or additionally, substrate 16 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as silicon germanium (SiGe), SiPC, GaAsP, AlInAs, AlGaAs, GaInAs, GaInP, and/or GaInAsP; or combinations thereof. Alternatively, substrate 16 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, substrate 16 includes one or more group III-V materials. In some implementations, substrate 16 includes one or more group II-IV materials. Substrate 16 includes various doped regions (not shown) depending on design requirements of core region 12 and I/O region 14. For example, core region 12 is an n-type device region, a p-type device region, or a combination thereof, and I/O region 14 is an n-type device region, a p-type device region, or a combination thereof. In some implementations, substrate 16 includes p-type doped regions (for example, p-type wells) doped with p-type dopants, such as boron, indium, other p-type dopant, or combinations thereof. In some implementations, substrate 16 includes n-type doped regions (for example, n-type wells) doped with n-type dopants, such as phosphorus, arsenic, other n-type dopant, or combinations thereof. In some implementations, substrate 16 includes doped regions formed with a combination of p-type dopants and n-type dopants. The various doped regions can be formed directly on and/or in substrate 16, for example, providing a p-well structure, an n-well structure, a dual-well structure, a raised structure, or combinations thereof.

Core region 12 includes at least one fin structure having less than or equal to two fins, and I/O region 14 includes at least one fin structure having greater than or equal to three fins. For example, core region 12 includes a fin structure 20A (having two fins 22A) and a fin structure 20B (having two fins 22B), and I/O region 14 includes a fin structure 20C (having six fins 22C). Though fin structures 20A-20C are multi-fin structures in the depicted embodiment, the present disclosure contemplates embodiments where fin structure 20A and/or fin structure 20B include only one fin. In the depicted embodiment, fin structures 20A-20C belong respectively to a first FinFET device, a second FinFET device, and a third FinFET device of integrated circuit device 10. Alternatively, in some implementations, fin structure 20A and fin structure 20B belong to a first FinFET device, and fin structure 20C belongs to a second FinFET device. In some implementations, fins 22A-22C are a portion of substrate 16 (such as a portion of a material layer of substrate 16). For example, where substrate 16 includes silicon, fins 22A-22C include silicon. Alternatively, in some implementations, fins 22A-22C are defined in a material layer, such as one or more semiconductor material layers, overlying substrate 16. For example, fins 22A-22C can include a semiconductor layer stack having various semiconductor layers (such as a heterostructure) disposed over substrate 16. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of integrated circuit device 10. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent. For example, the semiconductor layer stack includes silicon germanium layers having alternating silicon and/or germanium atomic percentages (for example, $Si_aGe_b/Si_cGe_d/Si_aGe_b/Si_cGe_d/Si_aGe_b/Si_cGe_d$ from bottom to top, where a and c are different atomic percentages of silicon and b and d are different atomic percentages of germanium). In some implementations, fins 22A, fins 22B, and/or fins 22C include the same materials and/or the same semiconductor layer stacks depending on design requirements of their respective FinFET device. In some implementations, fins 22A, fins 22B, and/or fins 22C include different materials and/or different semiconductor layer stacks depending on design requirements of their respective FinFET device.

Fin critical dimension (CD) loading optimization is achieved between core region 12 and I/O region 14 for subsequent processing by configuring fin structures of core region 12 and I/O region 14 with different critical dimensions. In some implementations, a critical dimension generally refers to a dimension, such as a fin width and/or a fin pitch, defined by design requirements to achieve desired performance of integrated circuit device 10. In FIGS. 1A-1C, fins 22A each have a width $w_1$, fins 22B each have a width $w_2$, and fins 22C each have a width $w_3$, where fin width is the critical dimension and widths $w_1$, width $w_2$, and width $w_3$ are configured to provide fin CD loading optimization. In some implementations, fin CD loading is defined as a difference between a core fin CD (or core fin width) of core region 12 and an I/O fin CD (or I/O fin width) of I/O region 14. Fin CD loading optimizes fin-to-fin spacing for etching processes used during gate formation when fin CD loading is greater than 0 (in other words, fin CD loading=core fin CD−I/O fin CD>0). For example, where the core fin CD is greater than the I/O fin CD (in other words, fins 22A and fins 22B each have a width that is greater than a width of fins 22C (for example, $w_1>w_3$ and $w_2>w_3$)), a spacing $S_1$ (distance) between adjacent fins 22A and/or a spacing $S_2$ between adjacent fins 22B is less than a spacing $S_3$ between adjacent fins 22C (in other words, $S_1<S_3$ and $S_2<S_3$). In some implementations, width $w_1$ is about 1 nm to about 30 nm, width $w_2$ is about 1 nm to about 30 nm, and width $w_3$ is about 1 nm to about 30 nm. In some implementations, spacing $S_1$ is about 10 nm to about 30 nm, spacing $S_2$ is about 10 nm to about 30 nm, and spacing $S_3$ is about 10 nm to about 30 nm. In furtherance of the depicted embodiment, fins 22A and fins 22B have substantially the same width (in other words, $w_1 \approx w_2$), and fins 22A and fins 22B have substantially the same spacing (in other words, $S_1 \approx S_2$) In some implementations, width $w_1$ and/or spacing $S_1$ of fins 22A is different than width $w_2$ and/or spacing $S_2$ of fins 22B depending on design requirements of core region 12. In FIGS. 1A-1C, fins 22A each have a height $h_1$ and a length $l_1$; fins 22B each have a height $h_2$ and a length $l_2$; and fins 22C each have a height $h_3$ and a length $l_3$. In some implementations, height $h_1$ is about 30 nm to about 150 nm, height $h_2$ is about 30 nm to about 150 nm, and height $h_3$ is about 30 nm to about 150 nm. In some implementations, length $l_1$ is about 30 nm to about 60 nm, length $l_2$ is about 30 nm to about 60 nm, and length $l_3$ is about 30 nm to about 60 nm.

A pitch $P_1$ of fin structure 20A generally refers to a sum of a width $w_1$ of fins 22A and spacing between adjacent fins 22A (such as $S_1$) (in other words, $P_1=w_1+S_1$). A pitch $P_2$ of fin structure 20B generally refers to a sum of a width $w_2$ of fins 22B and spacing between adjacent fins 22B (such as $S_2$) (in other words, $P_2=w_2+S_2$). A pitch $P_3$ of fin structure 20C generally refers to a sum of a width $w_3$ of fins 22C and spacing between adjacent fins 22C (such as $S_3$) (in other words, $P_3=w_3+S_3$). In the depicted embodiment, pitch $P_1$, pitch $P_2$, and pitch $P_3$ define a center-to-center distance between fins. In some implementations, pitch $P_1$, pitch $P_2$, and pitch $P_3$ are about 10 nm to about 80 nm. In some implementations, pitch $P_1$ is about 10 nm to about 600 nm, pitch $P_2$ is about 10 nm to about 600 nm, and pitch $P_3$ is about 10 nm to about 80 nm. In some implementations, fin structures 20A-20C have about the same pitch. In some implementations, fin structures 20A-20C have different pitches. In some implementations, pitch $P_1$, pitch $P_2$, and/or pitch $P_3$ is equivalent to a minimum fin pitch ($P_m$). In some implementations, the minimum fin pitch generally refers to a smallest fin pitch achievable by a lithography process and/or a fin fabrication process (including deposition, lithography, and/or etching processes) of a given IC technology node. In some implementations, the minimum fin pitch generally refers to a smallest fin pitch specified by design requirements for integrated circuit device 10.

Each of fins 22A-22C has an adjacent fin pitch, which can be configured to further optimize fin-to-fin spacing for etching processes used during gate formation in core region 12 and I/O region 14. Adjacent fin pitch ($P_{adjacent}$) is a sum of a fin's right fin pitch ($P_R$) and a fin's left fin pitch ($P_L$). Right fin pitch $P_R$ defines a distance between a center of a fin and a center of an adjacent (neighboring) fin positioned to the right of the fin, and left fin pitch $P_L$ defines a distance between the center of the fin and a center of an adjacent (neighboring) fin positioned to the left of the fin. In some implementations, the fin and the adjacent fin belong to the same fin structure and/or the same FinFET device. In some implementations, the fin and the adjacent fin belong to different fin structures and/or different FinFET devices. Core region 12 includes fin structures having a core adjacent fin pitch ($P_{adjacent-core}$) that is greater than or equal to three times a minimum fin pitch (in other words, $P_{adjacent-core} \geq 3P_m$), and I/O region 14 includes fin structures having an I/O core adjacent fin pitch ($P_{adjacent-IO}$) that is less than or equal to two times a minimum fin pitch (in other words, $P_{adjacent-IO} \leq 2P_m$). For example, in core region 12, the rightmost fin 22A of fin structure 20A has a left fin pitch that is equal to the minimum fin pitch ($P_L=P_m$) and a right fin pitch that is equal to two minimum fin pitches ($P_R=2P_m$), such that its adjacent fin pitch is equal to three times the minimum fin pitch (in other words, $P_{adjacent-20A}=P_m+2P_m=3P_m$). In some implementations, the right fin pitch of the rightmost fin 22C is greater than two times the minimum fin pitch and/or the left fin pitch of the rightmost fin 22C is less than the minimum fin pitch. In contrast, in I/O region 14, one of the center fins 22C of fin structure 20C has a left fin pitch that is equal to the minimum fin pitch ($P_L=P_m$) and a right fin pitch that is equal to the minimum fin pitch ($P_R=P_m$), such that its adjacent fin pitch is equal to two times the minimum fin pitch (in other words, $P_{adjacent-20C}=P_m+P_m=2P_m$). In some implementations, the left fin pitch and/or the right fin pitch of the center fin 22C is less than the minimum fin pitch. In the depicted embodiment, since fin structure 20A and fin structure 20B have less than or equal to two fins, fins 22A and fins 22B each have an adjacent fin pitch that defines the left fin pitch and/or the right fin pitch between a fin of a first FinFET device and a fin of a second FinFET device. In furtherance of the depicted embodiment, since fin structure 20C has greater than or equal to three fins, center fins 22C each have an adjacent fin pitch that defines the left fin pitch and the right fin pitch between fins of the same FinFET device.

The present disclosure contemplates variations in heights, widths, and/or lengths of fins 22A-22C that may arise from processing and fabrication of integrated circuit device 10. In the depicted embodiment, fins 22A-22C have tapered widths along their respective heights, where width $w_1$, width $w_2$, and width $w_3$ each represent an average of the varying widths. For example, the widths of fins 22A-22C decrease from lower portions of fins 22A-22C to upper portions of fins 22A-22C, such that average widths of the upper portions are less than average widths of the lower portions of fins 22A-22C. In some implementations, the widths can vary from about 5 nm to about 15 nm along fins 22A-22C depending on where the widths are measured along heights of fins 22A-22C. In some implementations, fin width varies depending on a position of a fin relative to other fins and/or relative to other features of integrated circuit device 10. For example, for fin structure 20C, width $w_3$ of center fins (in the depicted embodiment, fin structure 20C includes three center fins 22C) is greater than width $w_3$ of edge fins 22C (here, the leftmost fin 22C and the rightmost fin 22C enclosing the three center fins 22C). In another example, alternatively, width $w_3$ of the center fins is less than width $w_3$ of the edge fins. In both such implementations, width $w_3$ is less than width $w_1$ and width $w_2$. In furtherance of such implementations, width $w_3$ of the edge fins can represent an average width of the edge fins, and width $w_3$ of the center fins can represent an average width of the center fins. Though fins 22A-22C are depicted as having tapered widths, in some implementations, fins 22A-22C have substantially the same widths along their respective heights.

Fins 22A-22C are formed over substrate 16 using any suitable process. In some implementations, a combination of deposition, lithography and/or etching processes are performed to define fins 22A-22C extending from substrate 16 as illustrated in FIGS. 1A-1C. For example, forming fins 22A-22C includes performing a lithography process to form a patterned resist layer over substrate 16 (or a material layer, such as a heterostructure, disposed over substrate 16) and performing an etching process to transfer a pattern defined in the patterned resist layer to substrate 16 (or the material layer, such as the heterostructure, disposed over substrate 16). The lithography process can include forming a resist layer on substrate 16 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed)

portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 16 (or a material layer disposed over substrate 16). The etching process can include a dry etching process (for example, a reactive ion etching (RIE) process), a wet etching process, other suitable etching process, or combinations thereof. After the etching process, the patterned resist layer is removed from substrate 16, for example, by a resist stripping process. Alternatively, fins 22A-22C are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fins 22A-22C. Further, in some implementations, the exposure process can implement maskless lithography, electron-beam (e-beam) writing, ion-beam writing and/or nanoprint technology for patterning the resist layer.

In some implementations, a pattern defined in the patterned resist layer (or patterned mask layer) includes first openings having a first width for defining fin structure 20A and fin structure 20B and second openings having a second width for defining fin structure 20C, where the first width is greater than the second width. In such implementations, an etching process then uses the patterned resist layer as an etch mask to remove portions of substrate 16 (or a material layer disposed over substrate 16), such that fins 22A-22C are fabricated having fin CD loading between core region 12 and I/O region 14 as described herein. In some implementations, a pattern defined in the patterned resist layer (or patterned mask layer) includes first openings, second openings, and third openings for defining fin structure 20A, fin structure 20B, and fin structure 20C, where the first openings, second openings, and third openings have the same width. In such implementations, an etching process then uses the patterned resist layer as an etch mask to remove portions of substrate 16 (or a material layer disposed over substrate 16), such that fins 22A-22C have the same width. In furtherance of such implementations, a trimming process is then performed to trim fin structure 20C, thereby reducing a width of fins 22C, such that fins 22A-22C are fabricated having fin CD loading between core region 12 and I/O region 14 as described herein. The trimming process implements any suitable process for reducing the dimension of fins 22C. For example, in some implementations, the trimming process includes an etching process that can selectively etch fins 22C relative to other features of integrated circuit device 10. The etching process is a dry etching process, a wet etching process, or combinations thereof. In some implementations, a wet etching process implements an etching solution that includes ammonium hydroxide ($NH_4OH$), hydrogen peroxide ($H_2O_2$), sulfuric acid ($H_2SO_4$), tetramethylammonium hydroxide (TMAH), other suitable wet etching solution, or combinations thereof. For example, the wet etching solution can utilize an $NH_4OH$:$H_2O_2$ solution, an $NH_4OH$:$H_2O_2$:$H_2O$ solution (known as an ammonia-peroxide mixture (APM)), or an $H_2SO_4$:$H_2O_2$ solution (known as a sulfuric peroxide mixture (SPM)). In some implementations, a dry etching process implements an etchant gas that includes a fluorine-containing etchant gas (for example, $CF_4$, $SF_6$, $CH_2F_2$, $CHF_3$, and/or $C_2F_6$), an oxygen-containing gas, a chlorine-containing gas (for example, $Cl_2$, $CHCl_3$, $CCl_4$, and/or $BCl_3$), a bromine-containing gas (for example, HBr and/or $CHBR_3$), an iodine-containing gas, other suitable gases and/or plasmas, or combinations thereof. In some implementations, the trimming process implements an oxidation process. For example, the trimming process can expose fins 22C to an ozone environment, thereby oxidizing a portion of fins 22C, which is subsequently removed by a cleaning process and/or an etching process.

Figure 2C:
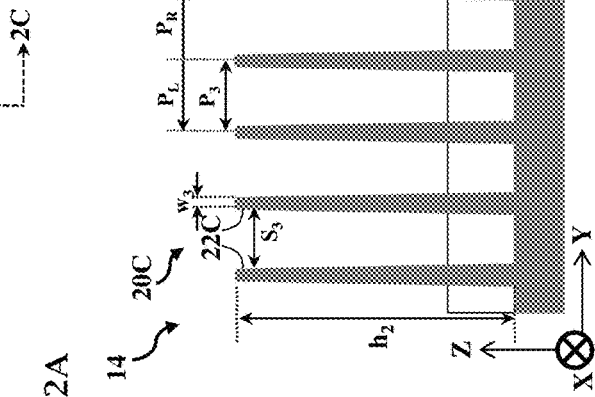
Figure 2B:
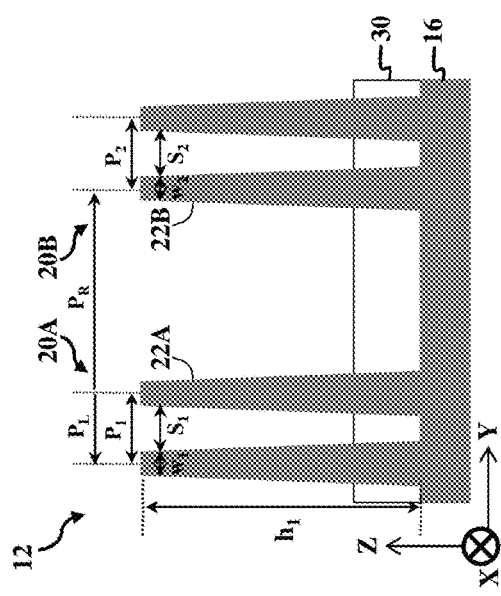

Turning to FIGS. 2A-2C, FIG. 2A is a top view of integrated circuit device 10, FIG. 2B is a fragmentary cross-sectional view of integrated circuit device 10 along line 2B-2B of FIG. 2A, and FIG. 2C is a fragmentary cross-sectional view of integrated circuit device 10 along line 2C-2C of FIG. 2A. Isolation feature(s) 30 is formed over and/or in substrate 16 to isolate various regions, such as various device regions, of integrated circuit device 10. For example, isolation feature 30 separates and isolates core region 12 from I/O region 14. Isolation feature 30 further separates and isolates fins 22A-22C from one another. In the depicted embodiment, isolation feature 30 surrounds a bottom portion of fins 22A-22C. Isolation feature 30 includes silicon oxide, silicon nitride, silicon oxynitride, other suitable isolation material (for example, including silicon, oxygen, nitrogen, carbon, or other suitable isolation constituent), or combinations thereof. Isolation feature 30 can include different structures, such as shallow trench isolation (STI) structures, deep trench isolation (DTI) structures, and/or local oxidation of silicon (LOCOS) structures. In some implementations, STI features can be formed by depositing an insulator material over substrate 16 after forming fins 22A-22C (in some implementations, such that the insulator material layer fills gaps (trenches) between fins 22A-22C) and etching back the insulator material layer to form isolation feature 30. In some implementations, STI features can be formed by etching a trench in substrate 16 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation feature 30. In some implementations, isolation feature 30 includes a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide). In some implementations, isolation feature 30 includes a dielectric layer disposed over a doped liner layer (including, for example, boron silicate glass (BSG) or phosphosilicate glass (PSG)).

Figure 3A:
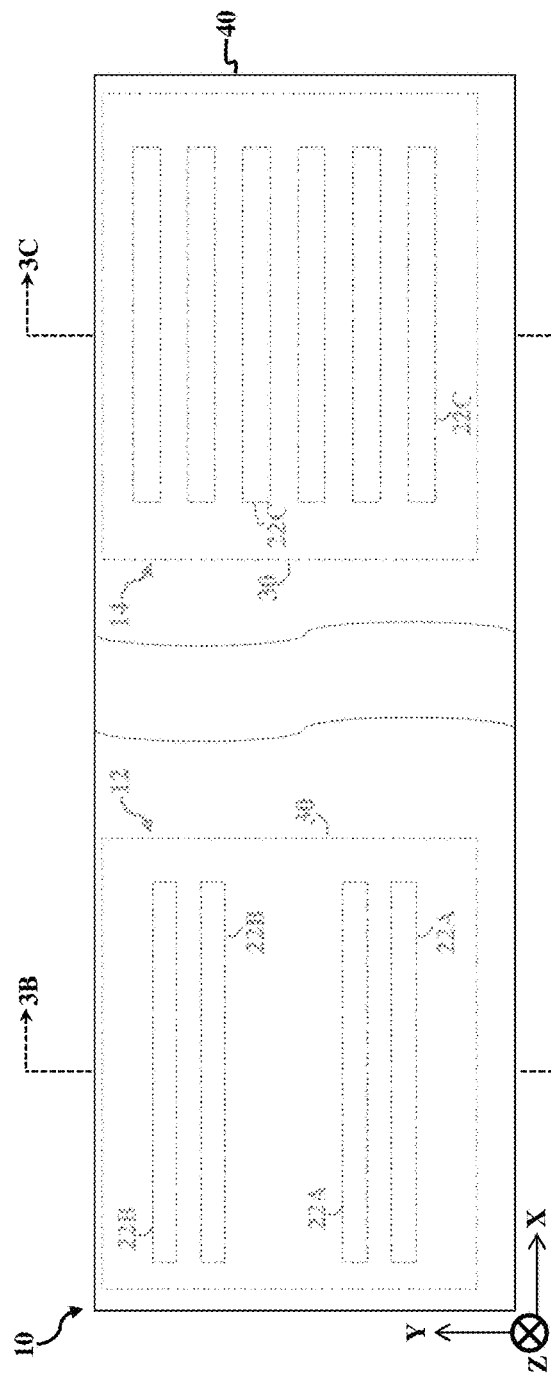
Figure 3C:
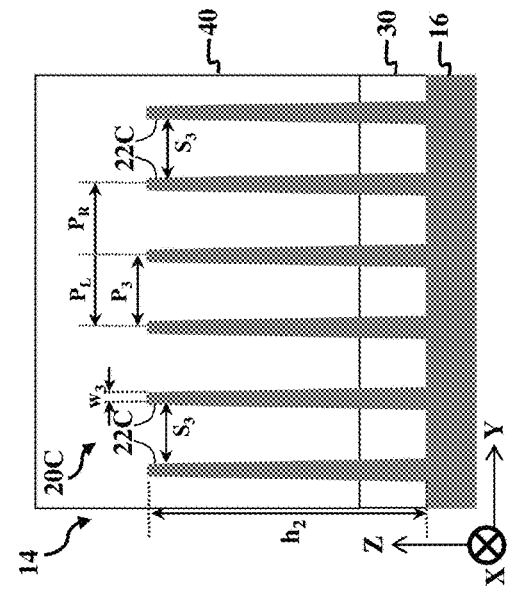
Figure 3B:
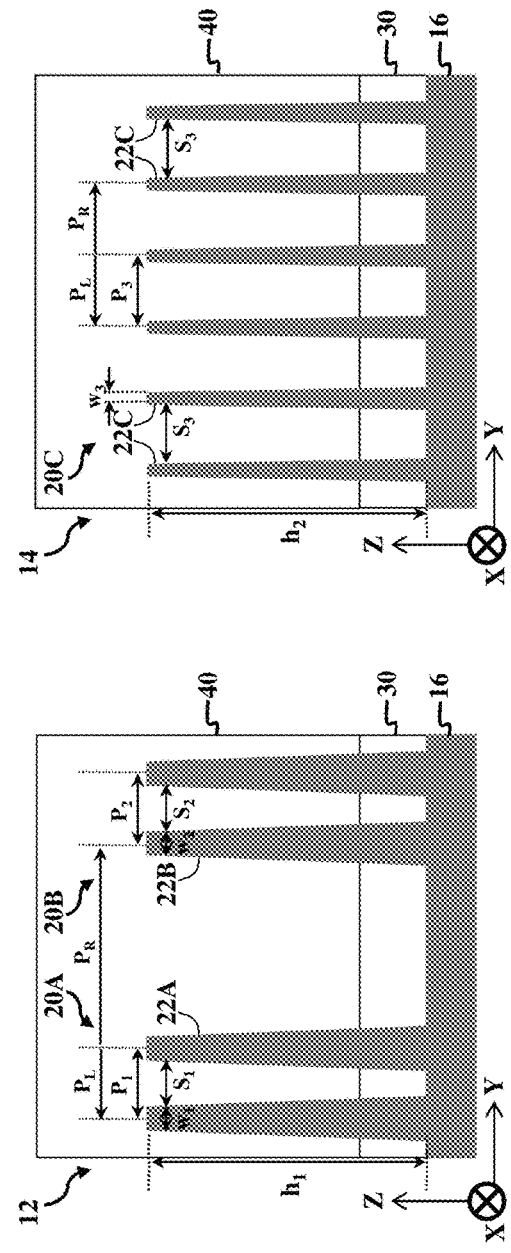

Turning to FIGS. 3A-3C, FIG. 3A is a top view of integrated circuit device 10, FIG. 3B is a fragmentary cross-sectional view of integrated circuit device 10 along line 3B-3B of FIG. 3A, and FIG. 3C is a fragmentary cross-sectional view of integrated circuit device 10 along line 3C-3C of FIG. 3A. A gate layer 40 is formed over fin structures 20A-20C disposed respectively in core region 12 and I/O region 14. For example, at least one deposition process is performed to form gate layer 40 over substrate 16, particularly over fin structures 20A-20C and isolation feature 30. Gate layer 40 fills spaces between fin structures 20A-20C and fills spaces between fins 22A-22C. The deposition process includes chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. Thereafter, a CMP process may be performed to planarize a top surface of gate layer 40. In the depicted embodiment, gate layer 40 includes a polysilicon layer. In some implementations, gate layer 40 further includes an interfacial layer (including a dielectric material, such as silicon oxide) disposed between fin structures 20A-20C and the polysilicon layer. In some implementations, gate layer 40 is a dummy gate stack that includes a dummy gate electrode and a dummy gate dielectric layer. In such implementations, a deposition process is performed to form a dummy gate dielectric layer over substrate 16, and a deposition process is performed to form a dummy gate electrode layer over the gate dielectric layer. In furtherance of such implementations, the dummy gate electrode includes polysilicon or other suitable dummy gate material, and the dummy gate dielectric includes a dielectric material (for example, silicon oxide), high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. Gate layer 40 may include numerous other layers, for example, capping layers, interface layers, diffusion layers, barrier layers, hard mask layers, or combinations thereof. In an example, a capping layer, such as a titanium nitride (TiN) capping layer, is disposed between the dummy gate dielectric (or substrate 16 where the dummy gate dielectric is omitted) and the dummy gate electrode.

Turning to FIGS. 4A-4C, FIG. 4A is a top view of integrated circuit device 10, FIG. 4B is a fragmentary cross-sectional view of integrated circuit device 10 along line 4B-4B of FIG. 4A, FIG. 4C is a fragmentary cross-sectional view of integrated circuit device 10 along line 4C-4C of FIG. 4A, FIG. 4D is a fragmentary cross-sectional view of integrated circuit device 10 along line 4D-4D of FIG. 4A, and FIG. 4E is a fragmentary cross-sectional view of integrated circuit device 10 along line 4E-4E of FIG. 4A. In FIGS. 4A-4E, a patterning layer 50 is formed over gate layer 40, where patterning layer 50 includes openings 52 that expose portions of gate layer 40 in core region 12 and openings 54 that expose portions of gate layer 40 in I/O region 14. In the depicted embodiment, patterning layer 50 includes a mask layer 56 disposed over gate layer 40, and a resist layer 58 (also referred to as a photoresist layer, photosensitive layer, imaging layer, patterning layer, or radiation sensitive layer) disposed over mask layer 56. Mask layer 56 includes a material having a different etching rate than a material of gate layer 40. For example, mask layer 56 includes silicon nitride, silicon oxide, silicon oxynitride, silicon carbide, silicon carbon nitride, other suitable material, or combinations thereof. In some implementations, mask layer 56 includes a material that has a low etch rate relative to a material of gate layer 40, such that gate layer 40 can be selectively etched relative to mask layer 56. Mask layer 56 is formed by any suitable process, such as a CVD process, to any suitable thickness. In some implementations, a silicon-containing and nitrogen-containing mask layer is formed using LPCVD. In some implementations, a silicon-containing and nitrogen-containing mask layer is formed by performing a process that includes thermal nitridation of a silicon-containing layer. Resist layer 58 includes any suitable resist material. Patterning layer 50 is formed by a lithography patterning process, which includes resist coating (for example, spin-on coating), soft baking, mask aligning, exposure, post-exposure baking, developing, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. In yet another alternative, the lithography patterning process implements nanoimprint technology. In some implementations, the lithography process implements an etching process, such as a dry etching, wet etching, other etching method, or combinations thereof. A rinsing process, such as a de-ionized (DI) water rinse, may be performed on gate layer 40 before forming patterning layer 50.

Turning to FIGS. 5A-5E, FIG. 5A is a top view of integrated circuit device 10, FIG. 5B is a fragmentary cross-sectional view of integrated circuit device 10 along line 5B-5B of FIG. 5A, FIG. 5C is a fragmentary cross-sectional view of integrated circuit device 10 along line 5C-5C of FIG. 5A, FIG. 5D is a fragmentary cross-sectional view of integrated circuit device 10 along line 5D-5D of FIG. 5A, and FIG. 5E is a fragmentary cross-sectional view of integrated circuit device 10 along line 5E-5E of FIG. 5A. In FIGS. 5A-5E, an etching process is performed using patterning layer 50 as a mask to remove exposed portions of gate layer 40, thereby forming gate structures 40A-40H. The etching process can include a dry etching process (for example, a reactive ion etching (RIE) process), a wet etching process, other suitable etching process, or combinations thereof. The etching process is unable to completely remove exposed portions of gate layer 40 within openings 54 in I/O region 14, leaving remaining gate layer portions 40' disposed between fins 22C. Gate structures 40F-40H thus have widths that vary along their lengths and heights, while gate structures 40A-40E have widths that are substantially the same along their lengths and heights. In FIG. 5A, along their length, a width of gate structures 40F-40H disposed over fins 22C is less than a width of gate structures 40F-40H disposed between fins 22C. Along their height, gate structures 40F-40H have tapered widths. For example, in FIG. 5E, a portion of a gate structure 40G disposed between fins 22C has a width that decreases along its height, such that a width of the portion of gate structure 40G proximate to isolation feature 30 (or substrate 16) is greater than a width of the portion of gate structure 40G proximate to patterning layer 50. In some implementations, a width of the portion of gate structure 40G above a top surface of fin structure 22C is substantially the same along its height, while a width the portion of gate structure 40G below the top surface of fin structures 22C decreases along its height. In conventional integrated circuit devices, where a core region and an I/O region have fin structures with substantially the same fin critical dimensions (widths), such remaining gate layer portions cause gate to source/drain breakdown, degrading device performance. In contrast, by implementing fin CD loading between core region 12 and I/O region 14 as described herein (and thus increasing fin spacing in I/O region 14 relative to fin spacing in core region 12), etch loading effects are minimized during the etching process, significantly reducing an amount (in particular, a thickness) of remaining gate layer portions 40' compared to conventional integrated circuit devices. The disclosed fin CD loading enlarges a breakdown voltage ($V_{BD}$) window for I/O region 14 (for example, by increasing fin-to-fin spacing in I/O region 14) while maintaining smaller fin-to-fin spacing desired for boosting performance of core region 12 (for example, by having core fin CD that is greater than I/O fin CD). The $V_{BD}$ window for I/O region 14 is thus enlarged without impacting performance of core region 12 and/or without impacting the gate fabrication process (in particular, polysilicon etching processes). Different embodiments may have different advantages, and no particular advantage is necessarily required of any embodiment.

Figure 6D:
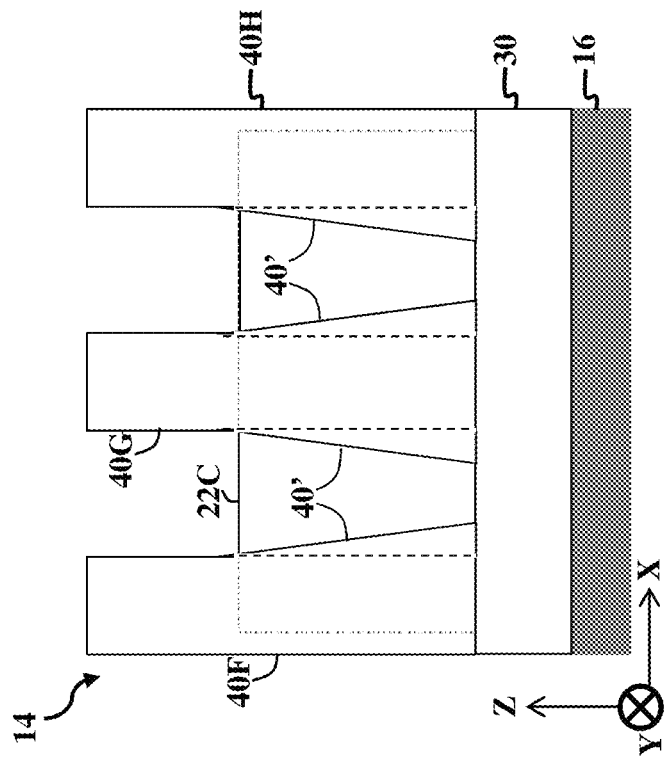
Figure 6E:
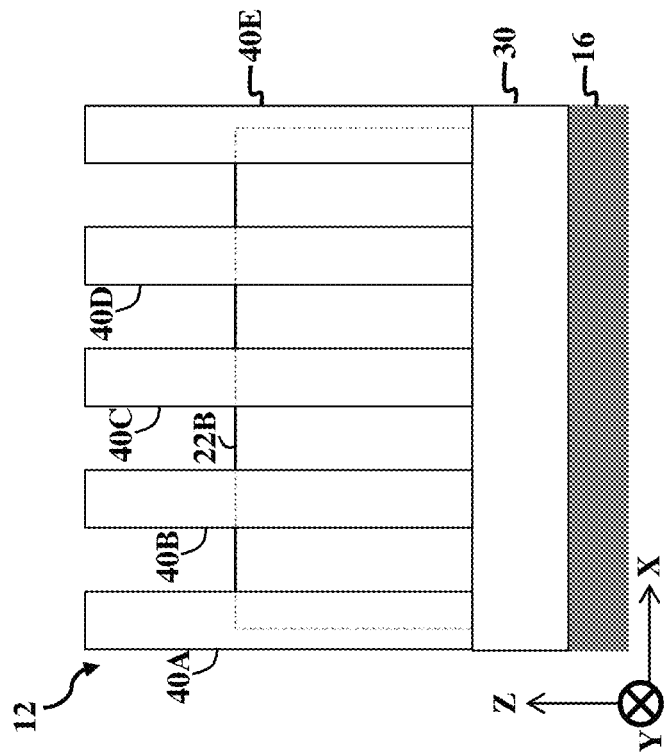

Turning to FIGS. 6A-6E, FIG. 6A is a top view of integrated circuit device 10, FIG. 6B is a fragmentary cross-sectional view of integrated circuit device 10 along line 6B-6B of FIG. 6A, FIG. 6C is a fragmentary cross-sectional view of integrated circuit device 10 along line 6C-6C of FIG. 6A, FIG. 6D is a fragmentary cross-sectional view of integrated circuit device 10 along line 6D-6D of FIG. 6A, and FIG. 6E is a fragmentary cross-sectional view of integrated circuit device 10 along line 6E-6E of FIG. 6A. In FIGS. 6A-6C, after patterning layer 50 is removed from gate layer 40, for example, by a resist stripping process, gate structures 40A-40H are disposed over fins 22A-22C. Gate structures 40A-40H extend along the y-direction (for example, substantially perpendicular to fins 22A-22C). In the depicted embodiment, gate structures 40A-40E are disposed over fin structure 20A and fin structure 20B, such that gate structures 40A-40E wrap a portion of fins 22A and fins 22B; and gate structures 40F-40H are disposed over fin structure 20C, such that gate structures 40F-40H wrap a portion of fins 22C. Gate structures 40A-40H are active gate structures or dummy gate structures depending on design requirements of integrated circuit device 10. "Active gate structure" generally refers to an electrically functional gate structure of integrated circuit device 10, whereas "dummy gate structure" generally refers to an electrically non-functional gate structure of integrated circuit device 10. In some implementations, a dummy gate structure mimics physical properties of an active gate structure, such as physical dimensions of the active gate structure, yet is inoperable (in other words, does not enable current to flow) in a FinFET. In some implementations, at least one of gate structures 40A-40E wraps channel regions of fins 22A and fins 22B, thereby interposing source/drain regions of fins 22A and fins 22B; and at least one of gate structures 40F-40H wraps channel regions of fins 22C, thereby interposing source/drain regions of fins 22C. In such implementations, the at least one of gate structures 40A-40H engage the channel regions of fins 22A-22C, such that current can flow between the source/drain regions of fins 22A-22C during operation. In some implementations, gate structures 40A-40H enable a substantially uniform processing environment, for example, enabling uniform epitaxial material growth in source/drain regions of fins 22A-22C (for example, when forming epitaxial source/drain features), uniform etch rates in source/drain regions of fins 22A-22C (for example, when forming source/drain recesses), and/or uniform, substantially planar surfaces (for example, by reducing (or preventing) CMP-induced dishing effects).

Integrated circuit device 10 can undergo further processing to complete fabrication. For example, in some implementations, gate spacers are formed adjacent to gate structures 40A-40H. For example, the gate spacers are disposed adjacent to (for example, along sidewalls of) gate layer 40. The gate spacers are formed by any suitable process and include a dielectric material. The dielectric material can include silicon, oxygen, carbon, nitrogen, other suitable material, or combinations thereof (for example, silicon oxide, silicon nitride, silicon oxynitride, or silicon carbide). For example, in the depicted embodiment, a dielectric layer including silicon and nitrogen, such as a silicon nitride layer, can be deposited over substrate 16 and subsequently anisotropically etched to form the gate spacers. In some implementations, the gate spacers include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to gate structures 40A-40H. In such implementations, the various sets of spacers can include materials having different etch rates. For example, a first dielectric layer including silicon and oxygen (for example, silicon oxide) can be deposited over substrate 16 and subsequently anisotropically etched to form a first spacer set adjacent to gate structures 40A-40H, and a second dielectric layer including silicon and nitrogen (for example, silicon nitride) can be deposited over substrate 16 and subsequently anisotropically etched to form a second spacer set adjacent to the first spacer set.

In some implementations, source/drain features, such as heavily doped source/drain regions and/or lightly doped source/drain (LDD) features, are formed in source/drain regions of fins 22A-22C. In some implementations, epitaxial source features and epitaxial drain features (referred to as epitaxial source/drain features) are formed in source/drain regions of fins 22A-22C. For example, a semiconductor material is epitaxially grown on exposed portions of fins 22A-22C, forming epitaxial source/drain features. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of fins 22A-22C. Epitaxial source/drain features are doped with n-type dopants and/or p-type dopants. In some implementations, epitaxial source/drain features are epitaxial layers including silicon and/or carbon, where silicon containing epitaxial layers or silicon carbon containing epitaxial layers are doped with phosphorous, other n-type dopant, or combinations thereof (for example, forming a Si:P epitaxial layer or a Si:C:P epitaxial layer). In some implementations, epitaxial source/drain features 260 are epitaxial layers including silicon and germanium, where the silicon germanium containing epitaxial layers are doped with boron, other p-type dopant, or combinations thereof (for example, forming a Si:Ge:B epitaxial layer). In some implementations, epitaxial source/drain features include materials and/or dopants that achieve desired tensile stress and/or compressive stress in channel regions of fins 22A-22C. In some implementations, epitaxial source/drain features are doped during deposition by adding impurities to a source material of the epitaxy process. In some implementations, epitaxial source/drain features are doped by an ion implantation process subsequent to a deposition process. In some implementations, annealing processes are performed to activate dopants in epitaxial source/drain features and/or other source/drain regions of integrated circuit device 10 (for example, HDD regions and/or LDD regions formed in source/drain regions of fins 22A-22C and/or epitaxial source/drain features).

A gate replacement process can then performed to replace a dummy gate stack of at least one of gate structures 40A-40H with a gate, such as a metal gate stack. For example, an inter-level dielectric (ILD) layer can be formed over substrate 16, for example, by a deposition process (such as CVD, PVD, ALD, HDPCVD, MOCVD, RPCVD, PECVD, LPCVD, ALCVD, APCVD, plating, other suitable methods, or combinations thereof). The ILD layer includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. The ILD layer can include a multilayer structure having multiple dielectric materials. Subsequent to the deposition of the ILD layer, a CMP process may be performed, such that a top portion of gate structures 40A-40H is reached (exposed), such as a dummy gate electrode (for example, a polysilicon layer) of gate layer 40. A portion of the at least one of gate structures 40A-40H (such as the dummy gate electrode of gate layer 40) is then removed, thereby forming a trench (opening), which may expose an interfacial layer and/or gate dielectric. In some implementations, an etching process selectively removes the dummy gate electrode (and, in some implementations, a dummy gate dielectric). The etching process is a dry etching process, a wet etching process, or combinations thereof. A selective etching process can be tuned, such that the dummy gate electrode layer has an adequate etch rate relative to the interfacial layer, the spacers, and/or the ILD layer.

A metal gate stack of the at least one of gate structures 40A-40H is then formed in the opening (trench). The metal gate stack of the at least one of gate structures 40A-40H include a gate dielectric (for example, a gate dielectric layer) and a gate electrode (for example, a work function layer and a bulk (or fill) conductive layer). The gate stacks may include numerous other layers, for example, capping layers, interface layers, diffusion layers, barrier layers, hard mask layers, or combinations thereof. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), TaAl, TaAlC, TiAlN, TaC, TaCN, TaSiN, manganese (Mn), zirconium (Zr), other suitable n-type work function materials, or combinations thereof. In some implementations, the work function layer includes a p-type work function material, such as TiN, TaN, ruthenium (Ru), Mo, Al, WN, $ZrSi_2$, $MoSi_2$, $TaSi_2$, $NiSi_2$, WN, other suitable p-type work function materials, or combinations thereof. The bulk conductive layer includes a suitable conductive material, such as Al, W, and/or Cu. In some implementations, the bulk conductive layer additionally or collectively includes polysilicon, Ti, Ta, metal alloys, other suitable materials, or combinations thereof. The gate dielectric layer, the work function layer, and the bulk conductive layer are formed by various deposition processes, such as ALD, CVD, PVD, and/or other suitable process. A CMP process can be performed to remove excess material (such as any excess work function layer and/or any excess metal fill layer), planarizing gate structures 40A-40H. It is understood that gate structures 40A-40H include gate stacks configured to achieve desired functionality according to design requirements of integrated circuit device 10, such that gate structures 40A-40H include the same or different layers and/or materials.

In some implementations, various contacts are formed to facilitate operation of integrated circuit device 10. For example, additional ILD layers can be formed over substrate 16 (in the depicted embodiment, over the ILD layer and gate structures 40A-40H). Contacts can be formed in the ILD layers, such as contacts that are electrically coupled with gate structures 40A-40H and contacts that are electrically coupled with source/drain regions of fin structures 20A-20C. The contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, the ILD layers and contacts are a portion of a multilayer interconnect (MLI) feature disposed over substrate 16. The MLI feature electrically couples various components of integrated circuit device 10, such that the various components are operable to function as specified by design requirements. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form a copper-based multilayer interconnection structure. Integrated circuit device 10 can undergo subsequent processing to complete fabrication depending on design requirements.

Figure 7:
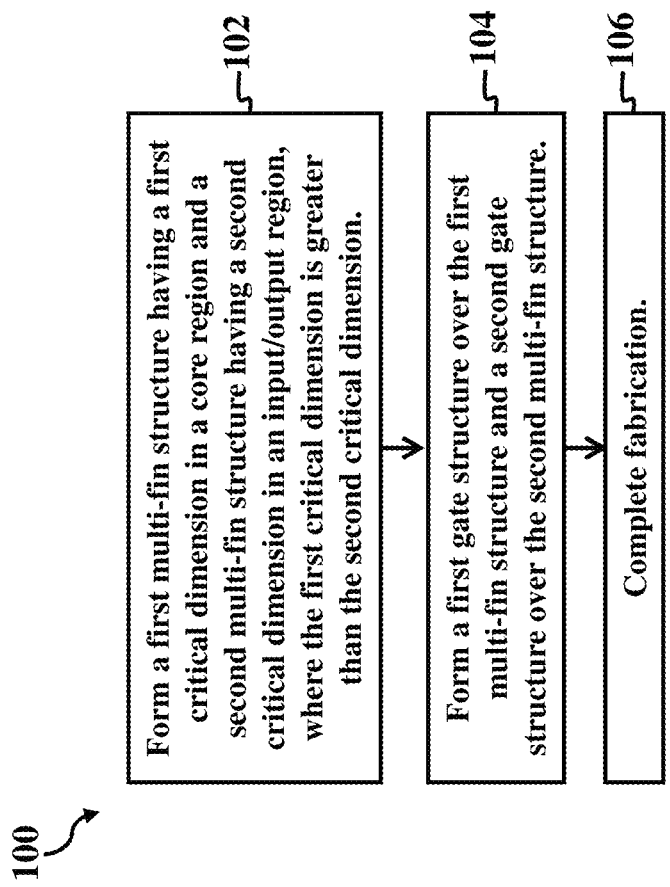
FIG. 7 is a flow chart of a method for fabricating an integrated circuit device according to various aspects of the present disclosure.

FIG. 7 is a flow chart of a method 100 for fabricating an integrated circuit device, such as integrated circuit device 10, according to various aspects of the present disclosure. At block 102, method 100 includes forming a first multi-fin structure having a first critical dimension in a core region and a second multi-fin structure having a second critical dimension in an input/output region. The first critical dimension is greater than the second critical dimension. In some implementations, the first multi-fin structure and the second multi-fin structure are formed as disclosed with reference to FIGS. 1A-1C. At block 104, method 100 includes forming a first gate structure over the first multi-fin structure and a second gate structure over the second multi-fin structure. In some implementations, the first gate structure and the second gate structure are formed as disclosed with reference to FIGS. 2A-2C, FIGS. 3A-3C, FIGS. 4A-4E, FIGS. 5A-5E, and FIGS. 6A-6E. At block 106, method 100 can continue to complete fabrication of the FinFET device. For example, in implementations where the first gate structure and/or the second gate structure include a dummy gate, a gate replacement process is performed to replace the dummy gate(s) with a metal gate(s). Additional steps can be provided before, during, and after method 100, and some of the steps described can be moved, replaced, or eliminated for additional embodiments of method 100.

Figure 8:
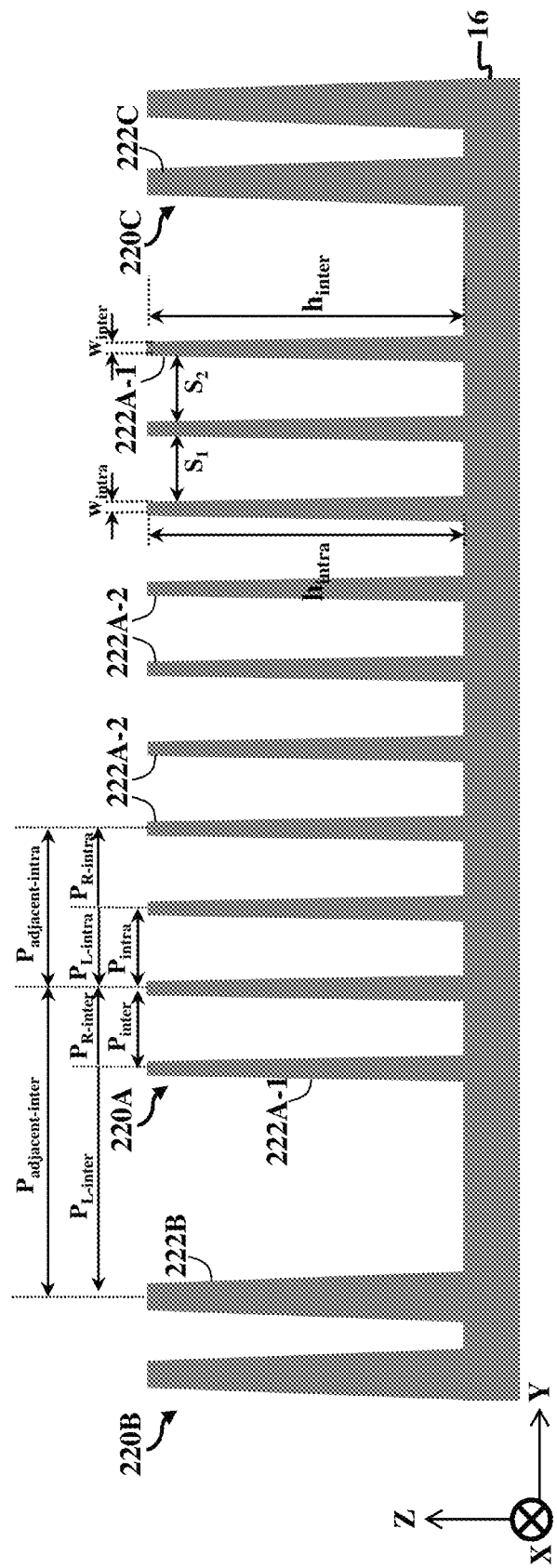
FIG. 8 is a fragmentary cross-sectional view of an integrated circuit device, in portion or entirety, according to various aspects of the present disclosure.

FIG. 8 is a fragmentary cross-sectional view of an integrated circuit device 200, in portion or entirety, according to various aspects of the present disclosure. Integrated circuit device 200 may be included in a microprocessor, a memory, and/or other integrated circuit device. In some implementations, integrated circuit device 200 is a portion of an IC chip, a SoC, or portion thereof, that includes various passive and active microelectronic devices, such as resistors, capacitors, inductors, diodes, PFETs, NFETs, MOSFETs, CMOS transistors, BJTs, LDMOS transistors, high voltage transistors, high frequency transistors, other suitable components, or combinations thereof. FIG. 8 has been simplified for the sake of clarity to better understand the inventive concepts of the present disclosure. Additional features can be added in integrated circuit device 200, and some of the features described below can be replaced, modified, or eliminated in other embodiments of integrated circuit device 200.

In FIG. 8, integrated circuit device 200 includes a substrate 116, similar to substrate 16 of integrated circuit device 10 described in detail above with reference to FIGS. 1A-1C. Integrated circuit device 200 further includes a fin structure 220A, a fin structure 220B (including fins 222B), and a fin structure 220C (including fins 222C). Fin structure 220A is disposed between fin structure 220B and fin structure 220C. In the depicted embodiment, fin structure 220A is a dense fin structure (for example, having greater than or equal to three fins), and fin structure 220B and fin structure 220C are isolated fin structures (for example, having less than or equal to two fins). Though fin structures 220A-220C are multi-fin structures in the depicted embodiment, the present disclosure contemplates embodiments where fin structure 220B and/or fin structure 220C include only one fin. The present disclosure further contemplates embodiments where fin structure 220A includes more or less fins than depicted in FIG. 8. In some implementations, fin structures 220A-220C belong to different FinFET devices of integrated circuit device 200. In some implementations, fin structures 220A-220C belong to the same FinFET device of integrated circuit device 200. In some implementations, fin structures 220A-220C belong to different regions of integrated circuit device 200. For example, in some implementations, fin structure 220A is disposed in an I/O region of integrated circuit device 200, and fin structure 220B and/or fin structure 220C are disposed in a core region of integrated circuit device 200.

Fin structure 220A has inter-fins 222A-1 and intra-fins 222A-2, where intra-fins 222A-2 are disposed between inter-fins 222A-1. In the depicted embodiment, inter-fins 22A-1 are the outermost fins of fin structure 220A, and intra-fins 222A-2 are the inner fins of fin structure 220A. In some implementations, an intra-fin generally refers to a fin disposed between fins of the same fin structure (here, fin structure 220A), whereas an inter-fin generally refers to a fin disposed between a fin of the same fin structure (or FinFET device) and a fin of a different fin structure (or FinFET device) (here, fin structure 220B or fin structure 220C). In some implementations, an intra-fin generally refers to a fin disposed between fins that share a gate structure and/or a source/drain feature, whereas an inter-fin generally refers to a fin disposed between fins that do not share a gate structure and/or a source/drain feature.

Fin CD loading optimization is achieved between inter-fins 222A-1 and intra-fins 222A-2 by configuring fin structure 220A with different critical dimensions. In the depicted embodiment, inter-fins 222A-1 have an inter-fin CD and intra-fins 222A-2 have an intra-fin CD, where the inter-fin CD is greater than the intra-fin CD. In some implementations, fin CD loading for a dense fin structure is defined as a difference between inter-fin CD and intra-fin CD, and fin CD loading optimizes fin-to-fin spacing for etching processes used during gate formation when fin CD loading is greater than 0 (in other words, dense fin CD loading=inter-fin CD−intra-fin CD>0). For example, inter-fins 222A-1 each have a width $w_{inter}$, and intra-fins 222A-2 each have a width $w_{intra}$. When, as in the depicted embodiment, inter-fins 222A-1 have a width that is greater than a width of intra-fins 222A-2 (in other words, $w_{inter} > w_{intra}$), a spacing $S_1$ (distance) between intra-fins 222A-2 is less than a spacing $S_2$ between inter-fins 222A-1 and intra-fins 222A-2 (in other words, $S_1 < S_2$). In some implementations, width $w_{inter}$ is about 1 nm to about 30 nm, and width $w_{intra}$ is about 1 nm to about 30 nm. In some implementations, spacing $S_1$ is about 10 nm to about 30 nm, and spacing $S_2$ is about 10 nm to about 30 nm. Inter-fins 222A-1 each have a height $h_{inter}$, and intra-fins 222A-2 each have a height $h_{intra}$. In some implementations, height $h_{inter}$ is nm, about 30 nm to about 150 and height $h_{intra}$ is about 30 nm to about 150 nm. A pitch P of fin structure 220A generally refers to a sum of a width w of fins (collectively including inter-fins 222A-1 and intra-fins 222A-2) and spacing S between adjacent fins (in other words, P=w+S). In the depicted embodiment, a pitch $P_{intra}$ of fin structure 220A generally refers to a center-to-center distance between intra-fins 222A-2, and a pitch $P_{inter}$ of fin structure 220A generally refers to a sum of a center-to-center distance between one of inter-fins 222A-1 and adjacent intra-fin 222A-2. In some implementations, pitch $P_{intra}$ is about 10 nm to about 50 nm, and pitch $P_{inter}$ is about 30 nm to about 600 nm. In some implementations, pitch $P_{intra}$ and pitch $P_{inter}$ are the same (for example, $P_{intra} = P_{intra}$). In some implementations, pitch $P_m$, and pitch $P_{inter}$ are different. For example, in some implementations, pitch $P_{intra}$ is greater than pitch $P_{inter}$. In some implementations, pitch $P_{intra}$ and/or pitch $P_{inter}$ is equivalent to a minimum fin pitch ($P_m$). In some implementations, the minimum fin pitch generally refers to a smallest fin pitch achievable by a lithography process and/or a fin fabrication process (including deposition, lithography, and/or etching processes) of a given IC technology node. In some implementations, the minimum fin pitch generally refers to a smallest fin pitch specified by design requirements for integrated circuit device 200.

In furtherance of the depicted embodiment, inter-fins 222A-1 have an inter-fin adjacent pitch ($P_{adjacent-inter}$) and intra-fins 222A-2 have an intra-fin adjacent pitch ($P_{adjacent-ultra}$), which can be configured to further optimize fin-to-fin spacing for etching processes used during gate formation as described above. Inter-fin adjacent pitch is a sum of an inter-fin's right fin pitch and an inter-fin's left fin pitch. An inter-fin's right fin pitch ($P_{R-inter}$) defines a distance between a center of an inter-fin and a center of an adjacent (neighboring) fin positioned to the right of the fin, and an inter-fin's left fin pitch ($P_{L-inter}$) defines a distance between the center of the inter-fin and a center of an adjacent (neighboring) fin positioned to the left of the fin. One of the inter-fin left fin pitch or the inter-fin right fin pitch is defined between an inter-fin and an intra-fin of the same fin structure, while the other of the inter-fin left fin pitch or the inter-fin right fin pitch is defined between the inter-fin and a fin of a different fin structure. Intra-fin adjacent pitch is a sum of an intra-fin's right fin pitch and an intra-fin's left fin pitch. An intra-fin's right fin pitch ($P_{R\text{-}intra}$) defines a distance between a center of an intra-fin and a center of an adjacent (neighboring) intra-fin positioned to the right of the intra-fin, and an intra-fin's left fin pitch ($P_{L\text{-}intra}$) defines a distance between the center of the intra-fin and a center of an adjacent (neighboring) intra-fin positioned to the left of the intra-fin. The intra-fin left fin pitch and the intra-fin right fin pitch are defined between fins of the same fin structure. In the depicted embodiment, inter-fins 222A-1 have an inter-fin adjacent pitch that is greater than or equal to three times a minimum fin pitch (in other words, $P_{adjacent\text{-}inter} \geq 3P_m$), and intra-fins 222A-2 have an intra-fin adjacent pitch that is less than or equal to two times a minimum fin pitch (in other words, $P_{adjacent\text{-}intra} \leq 2P_m$). For example, the leftmost inter-fin 222A-1 of fin structure 220A has a left fin pitch that is equal to two minimum fin pitches ($P_{L\text{-}inter}=2P_m$) and a right fin pitch that is equal to the minimum fin pitch ($P_{R\text{-}inter}=P_m$), such that inter fin adjacent fin pitch is equal to three times the minimum fin pitch (in other words, $P_{adjacent\text{-}inter}=2P_m + P_m=3P_m$). In some implementations, the left fin pitch of the leftmost inter-fin 222A-1 is greater than two times the minimum fin pitch and/or the left fin pitch of the leftmost inter-fin 222A-1 is less than the minimum fin pitch. In contrast, one of intra-fins 222A-2 has a left fin pitch that is equal to the minimum fin pitch ($P_{L\text{-}intra}=P_m$) and a right fin pitch that is equal to the minimum fin pitch ($P_{R\text{-}intra}=P_m$), such that intra-fin adjacent fin pitch is equal to two times the minimum fin pitch (in other words, $P_{adjacent\text{-}intra}=P_m + P_m=2P_m$). In some implementations, the left fin pitch and/or the right fin pitch of intra-fin 222A-2 is less than the minimum fin pitch.

The present disclosure contemplates variations in heights, widths, and/or lengths of inter-fins 222A-1 and intra-fins 222A-2 that may arise from processing and fabrication of integrated circuit device 200. In the depicted embodiment, inter-fins 222A-1 and intra-fins 222A-2 have tapered widths along their respective heights, where width $w_{intra}$ and width $w_{intra}$ each represent an average of the varying widths. For example, the widths of inter-fins 222A-1 and/or intra-fins 222A-2 decrease from lower portions of inter-fins 222A-1 and/or intra-fins 222A-2 to upper portions of inter-fins 222A-1 and/or intra-fins 222A-2, such that average widths of the upper portions are less than average widths of the lower portions. In some implementations, the widths can vary from about 5 nm to about 15 nm along inter-fins 222A-1 and/or intra-fins 222A-2 depending on where the widths are measured along heights of inter-fins 222A-1 and intra-fins 222A-2. Though inter-fins 222A-1 and intra-fins 222A-2 are depicted as having tapered widths, in some implementations, inter-fins 222A-1 and/or intra-fins 222A-2 have substantially the same widths along their respective heights.

The present disclosure provides for many different embodiments. An exemplary integrated circuit device includes a core region that includes a first multi-fin structure and an input/output region that includes a second multi-fin structure. The first multi-fin structure has a first width and the second multi-fin structure has a second width, where the first width is greater than the second width. In some implementations, the first multi-fin structure has a first fin spacing and the second multi-fin structure has a second fin spacing, where the first fin spacing is less than the second fin spacing.

In some implementations, the first multi-fin structure has less than or equal to two fins, and the second multi-fin structure has greater than or equal to three fins. In some implementations, a first adjacent fin pitch of the first multi-fin structure is greater than or equal to three times a minimum fin pitch and a second adjacent fin pitch of the second multi-fin structure is less than or equal to two times the minimum fin pitch. In some implementations, the first multi-fin structure and the second multi-fin structure include fins having tapered widths.

In some implementations, the second multi-fin structure includes an inter-fin having an inter-fin width and an intra-fin having an intra-fin width, where the inter-fin width is greater than the inter-fin width. In some implementations, the inter-fin has an inter-fin adjacent fin pitch that is greater than or equal to three times a minimum fin pitch. In some implementations, the intra-fin has an intra-fin adjacent fin pitch that is less than or equal to two times the minimum fin pitch. In some implementations, the integrated circuit device further includes a first gate structure disposed over the first multi-fin structure and a second gate structure disposed over the second multi-fin structure. In some implementations, the core region further includes a third multi-fin structure having a third width that is greater than the second width, and further wherein a spacing between the first multi-fin structure and the third multi-fin structure is greater than or equal to two times a minimum fin pitch.

Another exemplary integrated circuit device includes a multi-fin structure disposed over a substrate, where the multi-fin structure includes intra-fins disposed between inter-fins. The inter-fins have an inter-fin width and the intra-fins have an intra-fin width, where the inter-fin width is greater than the inter-fin width. The inter-fins have an inter-fin adjacent fin pitch that is greater than or equal to three times a minimum fin pitch. The intra-fins have an intra-fin adjacent fin pitch that is less than or equal to two times the minimum fin pitch. In some implementations, the multi-fin structure is disposed in an input/output region. In some implementations, the intra-fin adjacent pitch includes a first pitch between a first intra-fin of the intra-fins and a second intra-fin of the intra-fins and a second pitch between the first intra-fin and a third intra-fin of the intra-fins. In such implementations, the first pitch and the second pitch are equal to the minimum fin pitch. In some implementations, the integrated circuit device further includes a gate structure disposed over the multi-fin structure, wherein the gate structure traverses the multi-fin structure. In some implementations, the inter-fins and the intra-fins have tapered widths. In some implementations, the integrated circuit device further includes the multi-fin structure is disposed in a first region. In such implementations, the inter-fin adjacent pitch includes a first pitch between an inter-fin of the inter-fins and an adjacent intra-fin of the intra-fins and a second pitch between the inter-fin and a fin disposed in a second region that is adjacent to the first region. The first pitch is equal to the minimum fin pitch. The second pitch is greater than or equals two times the minimum fin pitch. In some implementations, the first region is an input/output region and the second region is a logic region.

An exemplary method includes forming a first multi-fin structure in a core region, forming a second multi-fin structure in a peripheral region, and forming a first gate structure over the first multi-fin structure and a second gate structure over the second multi-fin structure. The first multi-fin structure has a first width. The second multi-fin structure has a second width. The first width is greater than the second width. In some implementations, the first multi-fin structure has less than or equal to two fins and the second multi-fin structure has greater than or equal to three fins. In some implementations, a first adjacent fin pitch of the first multi-fin structure is at least three times a minimum fin pitch and a second adjacent fin pitch of the second multi-fin structure is less than or equal to two times the minimum fin pitch. In some implementations, the first multi-fin structure and the second multi-fin structure are formed at the same time. In some implementations, the forming the first multi-fin structure and the forming the second multi-fin structure includes forming a patterned mask layer over a substrate, where the patterned mask layer includes first openings for defining the first multi-fin structure and second openings for defining the second multi-fin structure, and etching the substrate exposed by the first openings and the second openings in the patterned mask layer. In some implementations, the first gate structure and the second gate structure include dummy gates, and the method further includes replacing the dummy gates with metal gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device comprising:
a core region that includes a first fin-like field effect transistor (FinFET) having a first multi-fin structure and a first gate structure, wherein the first multi-fin structure includes first fins, each of the first fins has a first portion disposed between second portions, and the first gate structure is disposed over and wraps the first portion of each of the first fins of the first multi-fin structure;
an input/output region that includes a second FinFET having a second multi-fin structure and a second gate structure, wherein the second multi-fin structure includes second fins, each of the second fins has a third portion disposed between fourth portions, and the second gate structure is disposed over and wraps the third portion of each of the second fins of the second multi-fin structure;
wherein the first fins have a first fin width and the second fins have a second fin width, wherein the first fin width is greater than the second fin width and a number of the first fins is less than a number of the second fins; and
wherein the first multi-fin structure and the first gate structure are completely within the core region and the second multi-fin structure and the second gate structure are completely within the input/output region.

2. The integrated circuit device of claim 1, wherein the first multi-fin structure has a first fin spacing and the second multi-fin structure has a second fin spacing, wherein the first fin spacing is less than the second fin spacing.

3. The integrated circuit device of claim 1, wherein:
the number of the first fins is less than or equal to two;
each of the first fins has a first adjacent fin pitch that is greater than or equal to three times a minimum fin pitch, wherein the first adjacent fin pitch is a sum of a right first fin pitch and a left first fin pitch, wherein the right first fin pitch is between a respective first fin and a directly adjacent neighboring fin positioned right of the respective first fin and the left first fin pitch is between the respective first fin and a directly adjacent neighboring fin positioned left of the respective first fin;
the number of the second fins is greater than or equal to three; and
the second fins include center fins disposed between edge fins, wherein each of the center fins have a second adjacent fin pitch that is less than or equal to two times the minimum fin pitch, wherein the second adjacent fin pitch is a sum of a right second fin pitch and a left second fin pitch, wherein the right second fin pitch is between a respective second fin and a directly adjacent neighboring fin positioned right of the respective second fin and the left second fin pitch is between the respective second fin and a directly adjacent neighboring fin positioned left of the respective second fin.

4. The integrated circuit device of claim 1, wherein the second fins include an inter-fin having an inter-fin width and an intra-fin having an intra-fin width, wherein the inter-fin width is greater than the intra-fin width, wherein the inter-fin is a first one of the second fins disposed directly between a neighboring second fin of the second multi-fin structure and a fin of a different multi-fin structure, and further wherein the intra-fin is a second one of the second fins disposed directly between neighboring second fins of the second multi-fin structure.

5. The integrated circuit device of claim 4, wherein:
the inter-fin has an inter-fin adjacent fin pitch that is greater than or equal to three times a minimum fin pitch; and
the intra-fin has an intra-fin adjacent fin pitch that is less than or equal to two times the minimum fin pitch.

6. The integrated circuit device of claim 1, wherein the first fins and the second fins have tapered widths.

7. The integrated circuit device of claim 1, wherein along a length of the first gate structure and a length of the second gate structure, a width of the first gate structure is substantially the same and a width of the second gate structure disposed over the second fins is less than a width of the second gate structure disposed between the second fins.

8. The integrated circuit device of claim 1, wherein the core region further includes a third FinFET having a third multi-fin structure that includes third fins, wherein each of the third fins has a fifth portion disposed between sixth portions and the first gate structure is further disposed over and wraps the fifth portion of each of the third fins, wherein the third fins have a third fin width that is greater than the second fin width, a number of the third fins is less than a number of the second fins, and a spacing between the first multi-fin structure and the third multi-fin structure is greater than a pitch of the first multi-fin structure and a pitch of the third multi-fin structure.

9. An integrated circuit device comprising:
a first fin-like field effect transistor (FinFET) having a multi-fin structure disposed over a substrate, wherein the multi-fin structure includes intra-fins disposed between a first inter-fin and a second inter-fin;
wherein the first inter-fin, the second inter-fin, and the intra-fins are completely disposed within one region of the integrated circuit device;
wherein the first inter-fin and the second inter-fin are edge fins of the multi-fin structure of the first FinFET having an inter-fin width and the intra-fins are center fins of the multi-fin structure of the first FinFET having an intra-fin width, wherein the inter-fin width is greater than the intra-fin width;

wherein the first inter-fin has a first inter-fin adjacent fin pitch that is a sum of a first right fin pitch and a first left fin pitch, wherein the first right fin pitch is between the first inter-fin and a directly adjacent respective intra-fin positioned right of the first inter-fin and the first left fin pitch is between the first inter-fin and a directly adjacent fin of a second FinFET positioned left of the first inter-fin;

wherein the second inter-fin has a second inter-fin adjacent fin pitch that is a sum of a second right fin pitch and a second left fin pitch, wherein the second right fin pitch is between the second inter-fin and a directly adjacent fin of a third FinFET positioned right of the second inter-fin and the second left fin pitch is between the second inter-fin and a directly adjacent respective intra-fin positioned left of the second inter-fin;

wherein the second inter-fin adjacent fin pitch and the first inter-fin adjacent fin pitch are greater than or equal to three times a minimum fin pitch; and wherein the intra-fins have an intra-fin adjacent fin pitch that is less than or equal to two times the minimum fin pitch.

10. The integrated circuit device of claim 9, wherein:
the first right fin pitch and the second left fin pitch are each equal to the minimum fin pitch; and
the first left fin pitch and the second right fin pitch is greater than or equal to two times the minimum fin pitch.

11. The integrated circuit device of claim 10, wherein the minimum fin pitch is a smallest fin pitch specified by design requirements for the integrated circuit device.

12. The integrated circuit device of claim 9, wherein the minimum fin pitch is a smallest fin pitch achievable by a fin fabrication process of a given integrated circuit technology node.

13. The integrated circuit device of claim 9, wherein the one region of the integrated circuit device is an input/output region.

14. The integrated circuit device of claim 9, wherein the first inter-fin, the second inter-fin, and the intra-fins have tapered widths.

15. The integrated circuit device of claim 9, wherein the first FinFET further includes a gate structure disposed over a portion of the multi-fin structure, wherein the gate structure traverses the multi-fin structure.

16. A method comprising:
forming a first multi-fin structure of a first fin-like field effect transistor (FinFET) completely within a core region, wherein the first multi-fin structure has first fins having a first fin width and each of the first fins has a first portion disposed between second portions;

forming a second multi-fin structure of a second FinFET completely within a peripheral region, wherein the second multi-fin structure has second fins having a second fin width and each of the second fins has a third portion disposed between fourth portions, and further wherein the first fin width is greater than the second fin width and a number of the first fins is less than a number of the second fins; and forming a first gate structure over and wrapping the first portion of each of the first fins of the first multi-fin structure and a second gate structure over and wrapping the third portion of each of the second fins of the second multi-fin structure.

17. The method of claim 16, wherein:
the number of the first fins is less than or equal to two;
each of the first fins has a first adjacent fin pitch that is at least three times a minimum fin pitch, wherein the first adjacent fin pitch is a sum of a right first fin pitch and a left first fin pitch, wherein the right first fin pitch is between a respective first fin and a directly adjacent neighboring fin positioned right of the respective first fin and the left first fin pitch is between the respective first fin and a directly adjacent neighboring fin positioned left of the respective first fin;
the number of the second fins is greater than or equal to three; and
the second fins include center fins disposed between edge fins, wherein each of the center fins have a second adjacent fin pitch that is less than or equal to two times the minimum fin pitch, wherein the second adjacent fin pitch is a sum of a right second fin pitch and a left second fin pitch, wherein the right second fin pitch is between a respective second fin and a directly adjacent neighboring fin positioned right of the respective second fin and the left second fin pitch is between the respective second fin and a directly adjacent neighboring fin positioned left of the respective second fin.

18. The method of claim 16, wherein the first multi-fin structure and the second multi-fin structure are formed at the same time.

19. The method of claim 16, wherein the forming the first multi-fin structure and the forming the second multi-fin structure includes:
forming a patterned mask layer over a substrate, wherein the patterned mask layer includes first openings for defining the first multi-fin structure and second openings for defining the second multi-fin structure; and
etching the substrate exposed by the first openings and the second openings in the patterned mask layer.

20. The method of claim 16, wherein the first gate structure and the second gate structure include dummy gates, and the method further includes replacing the dummy gates with metal gates.

* * * * *